United States Patent
Kajigaya

(10) Patent No.: US 9,293,190 B2
(45) Date of Patent: Mar. 22, 2016

(54) SEMICONDUCTOR STORAGE DEVICE

(71) Applicant: PS4 LUXCO S.A.R.L., Luxembourg (LU)

(72) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/618,076

(22) Filed: Feb. 10, 2015

(65) Prior Publication Data

US 2015/0162072 A1    Jun. 11, 2015

Related U.S. Application Data

(60) Continuation of application No. 13/800,935, filed on Mar. 13, 2013, now Pat. No. 8,982,645, which is a division of application No. 12/929,696, filed on Feb. 9, 2011, now abandoned.

(30) Foreign Application Priority Data

Feb. 18, 2010    (JP) .................................. 2010-033709

(51) Int. Cl.

| | |
|---|---|
| G11C 11/4093 | (2006.01) |
| G11C 11/4091 | (2006.01) |
| G11C 5/02 | (2006.01) |
| G11C 7/08 | (2006.01) |
| G11C 7/10 | (2006.01) |
| G11C 11/4096 | (2006.01) |

(52) U.S. Cl.
CPC ............ *G11C 11/4093* (2013.01); *G11C 5/025* (2013.01); *G11C 7/08* (2013.01); *G11C 7/1051* (2013.01); *G11C 7/1069* (2013.01); *G11C 11/4091* (2013.01); *G11C 11/4096* (2013.01); *G11C 2207/005* (2013.01)

(58) Field of Classification Search
CPC ...................... G11C 11/4091; G11C 11/4093
USPC ..................... 365/189.02, 189.15, 189.17, 51
See application file for complete search history.

(56) References Cited

U.S. PATENT DOCUMENTS

| | | | | |
|---|---|---|---|---|
| 6,665,203 B2 * | 12/2003 | Fujisawa et al. | ................. | 365/51 |
| 7,495,943 B2 * | 2/2009 | Takemura et al. | ............... | 365/51 |

* cited by examiner

*Primary Examiner* — Hoai V Ho
*Assistant Examiner* — Tri Hoang
(74) *Attorney, Agent, or Firm* — Kunzler Law Group, PC

(57) ABSTRACT

A semiconductor includes a plurality of memory cell arrays each of which includes a plurality of memory cells. Bitlines extend in one direction in the memory cell arrays to transfer data stored in the memory cells. Wordlines extend perpendicular to the bitlines in the memory cell arrays to select at least one of the memory cells. Local data lines extend parallel to the wordlines outside of the memory cell arrays and convey signals from bitlines. Global data lines convey signals from the local data lines. The global data lines include a part extending parallel to the wordlines and the part is disposed over another one of the memory cell arrays other than a selected memory cell array.

15 Claims, 26 Drawing Sheets

SEMICONDUCTOR STORAGE DEVICE

REFERENCE TO RELATED APPLICATION

This application is a Continuation Application of U.S. patent application Ser. No. 13/800,935, filed on Mar. 13, 2013, now U.S. Pat. No. 8,982,645, which issued on Mar. 17, 2015, which is a Divisional Application of U.S. patent application S/N 12/929,696, filed on Feb. 9, 2011, now abandoned.

This application is based upon and claims the benefit of the priority of Japanese patent application No. 2010-033709, filed on Feb. 18, 2010, the disclosure of which is incorporated herein in its entirety by reference thereto. This invention relates to a semiconductor storage device and, more particularly, to a semiconductor storage device having an architecture for controlling enable timing of a main amplifier.

BACKGROUND

Technical Field

A technique known for use in conventional semiconductor storage devices causes read-out timing of a memory cell array to follow up process or voltage variations or the like by controlling the enable timing of a main amplifier for amplifying and outputting data, which has been read out of the memory cell array, via a sense amplifier.

For example, Patent Document 1 discloses, in relation to a multiple-bit DRAM, providing three single-ended main amplifiers and one double-ended main amplifier in correspondence with four memory cell blocks, disposing four read-out buses and four output buffers in correspondence with each main amplifier, and activating the four output buffers in response to a detection signal generated upon completion of amplification by a differential amplifier within the double-ended main amplifier.

Further, a technique known heretofore for use in an SRAM controls the enable timing of a sense amplifier using a replica delay circuit that employs a dummy bitline.

For example, Patent Document 2 discloses a technique, for use in a semiconductor memory adapted so that a signal that enables a sense amplifier is generated based upon a signal on a dummy bitline, for connecting a dummy memory cell to the dummy bitline, whereby the parasitic capacitance of the dummy bitline and its charge/discharge current compensate for a fluctuation in the parasitic capacitance of a bitline and in the charge/discharge current thereof.

Further, Patent Document 3 discloses a technique which, in order to monitor the time at which the potential difference of a readout signal appears on a bitline using an actual memory cell, simultaneously connects the outputs of a number of R-bit cells in duplicate columns, accesses the number of R-bit cells using a generated signal and generates a sense-enable signal for application to a sense amplifier.

Further, Non-Patent Document 1 discloses a technique for optimizing the length of a dummy bitline when the enable timing of a sense amplifier in an SRAM is controlled by the dummy bitline.

Non-Patent Document 2 discloses a technique for optimizing the number of dummy cells connected to a dummy bitline by using a dummy wordline when the enable timing of a sense amplifier in an SRAM is controlled by the dummy bitline.
[Patent Document 1]
Japanese Patent Kokai Publication No. JP-H08-167286A
[Patent Document 2]
Japanese Patent Kokai Publication No. JP-H09-259589A
[Patent Document 3]
Japanese Patent Kokai Publication No. JP2001-351385A
[Non-Patent Document 1]
B. S. Amrutur and M. A. Horowitz, "A Replica Technique for Wordline and Sense Control in Low-Power SRAM's", IEEE Journal of Solid-State Circuits, Vol. 33, No. 8, August 1998, pp. 1208-1219
[Non-Patent Document 2]
K. Osada et al, "Universal-Vdd 0.65-2.0-V 32-kB Cache Using a Voltage-Adapted Timing-Generation Scheme and a Lithographically Symmetrical Cell", IEEE Journal of Solid-State Circuits, Vol. 36, No. 11, November 2001, pp. 1738-1744

SUMMARY

The entire disclosures of above mentioned Patent Documents and Non-patent Documents are incorporated herein by reference thereto. The following analyses are given by the present invention. A problem with the technique of Patent Document 1 is that since an output buffer is activated upon sensing completion of amplification by a main amplifier, enable timing of the main amplifier cannot be controlled in a memory having sense amplifiers distributed within a large-scale memory cell array block.

A problem with the techniques of Patent Documents 2 and 3 is that since enable timing of a sense amplifier is controlled by monitoring the operation of a bitline to which a memory cell is connected, the enable timing of a main amplifier cannot be controlled in a memory having sense amplifiers distributed within a large-scale memory cell array block.

A problem with the techniques of Non-Patent Documents 1 and 2 is that since the amount of delay of a dummy bitline is optimized by the length of the dummy bitline (the parasitic capacitance of the dummy bitline) or by the number of dummy cells (the number of dummy bitlines), enable timing of a main amplifier cannot be controlled in a memory having sense amplifiers distributed within a large-scale memory cell array block.

Furthermore, there is a problem with the techniques of Patent Documents 1 to 3 and Non-Patent Documents 1 and 2 in that a readout signal reference signal cannot be applied to a main amplifier.

Consequently, in a case where sense amplifiers are distributed within a large-scale memory cell array block, operating margin cannot be improved and high-speed readout cannot be achieved. Thus there is much to be desired in the art.

In a first aspect of the present invention, there is provided a semiconductor storage device that comprises: a memory cell array having a plurality of memory cells; sense amplifiers, which are arranged adjacent to the memory cell array, for amplifying signals that have been read out of corresponding ones of the memory cells; readout signal lines; a plurality of connection circuits for selectively connecting the sense amplifiers and the readout signal lines; and a plurality of main amplifiers for amplifying and outputting signals that have been read out of the sense amplifiers via the readout signal lines by the connection circuits selected by selection signals. An enable signal line is connected to the main amplifiers; and an enable signal generating circuit is provided for outputting a main amplifier enable signal to the enable signal line. The enable signal generating circuit is placed in close proximity to the connection circuits.

In the semiconductor storage device of the present invention, preferably the enable signal generating circuit responds to receipt of the selection signal by generating the enable signal in conformity with timing at which the sense amplifiers and the readout signal lines are connected by the connection circuits.

In the semiconductor storage device of the present invention, preferably the enable signal line is routed in close proximity to the readout signal lines.

In the semiconductor storage device of the present invention, preferably the connection circuits connect a plurality of the sense amplifiers and a corresponding plurality or plurality of sets of the readout signal lines.

In the semiconductor storage device of the present invention, preferably the enable signal generating circuit is connected to each of the plurality of connection circuits via the enable signal line and the enable signal causes the plurality of main amplifiers to start simultaneously.

In a second aspect of the present invention, a semiconductor storage device comprises: a memory cell array having a plurality of memory cells; sense amplifiers, which are arranged adjacent to the memory cell array, for amplifying signals that have been read out of corresponding ones of the memory cells; readout signal lines; connection circuits for selectively connecting the sense amplifiers and the readout signal lines; a plurality of main amplifiers for amplifying and outputting signals that have been read out of the sense amplifiers via the readout signal lines by the connection circuits selected by selection signals; a reference signal line connected to the main amplifiers; and a reference signal generating circuit for outputting a main amplifier reference signal to the reference signal line. The reference signal generating circuit is placed in close proximity to the connection circuits.

In the semiconductor storage device of the present invention, preferably the reference signal generating circuit responds to receipt of the selection signal by generating the reference signal in conformity with timing at which the sense amplifiers and the readout signal lines are connected by the connection circuits.

In the semiconductor storage device of the present invention, preferably the reference signal line is routed in close proximity to the readout signal lines.

In the semiconductor storage device of the present invention, preferably the connection circuits connect a plurality of the sense amplifiers and a corresponding plurality of the readout signal lines.

In the semiconductor storage device of the present invention, preferably the reference signal generating circuit is connected to each of the plurality of main amplifiers via the reference signal line, and the reference signal is shared by the plurality of main amplifiers.

In accordance with the first aspect of the present invention, in a semiconductor storage device, such as a DRAM, having a large-scale memory array block, when readout signals are transferred from a plurality of sense amplifiers distributed within the memory cell array block to corresponding main amplifiers and the transferred readout signals are amplified by the main amplifiers, the main amplifier enable timing and the readout signal transfer timing can always be made to coincide. As a result, the operating margin of the semiconductor storage device can be improved and high-speed readout can be achieved.

In accordance with the second aspect of the present invention, in a semiconductor storage device, such as a DRAM, having a large-scale memory array block, when readout signals are transferred from a plurality of sense amplifiers distributed within the memory cell array block to corresponding main amplifiers and the transferred readout signals are amplified by the main amplifiers, the main amplifier enable timing and the readout signal transfer timing can always be made to coincide and, moreover, even if the readout signals are transferred by a single-ended arrangement, they can be amplified as differential signals by the main amplifiers. As a result, the number of readout signals can be halved and chip area is reduced while the operating margin of the semiconductor storage device is assured. Other features and advantages of the present invention will be apparent from the following description taken in conjunction with the accompanying drawings, in which like reference characters designate the same or similar parts throughout the figures thereof.

PREFERRED MODES

In the following, preferred modes are illustrated by reference to the drawings, which, however, should not be understood as restrictive. The reference to the symbols of the drawings relate merely to help understanding without restrictive intent. A semiconductor storage device according to a first aspect of the present invention comprises: a memory cell array (MCA in FIGS. 11, 16 and 21) having a plurality of memory cells (MC in FIGS. 11, 16 and 21); sense amplifiers (SA in FIGS. 11, 16 and 21), which are arranged adjacent to the memory cell array, for amplifying signals that have been read out of corresponding ones of the memory cells; readout signal lines (GDL, /GDL in FIGS. 12, 17 and 22); a plurality of connection circuits (Q5, LDL, /LDL in FIGS. 11, 16 and 21, and SW in FIGS. 12, 17 and 22) for selectively connecting the sense amplifiers and the readout signal lines; a plurality of main amplifiers (MA in FIGS. 12, 17 and 22) for amplifying and outputting signals that have been read out of the sense amplifiers via the readout signal lines by the connection circuits selected by selection signals (YS in FIGS. 11, 16 and 21); an enable signal line (/MAE in FIGS. 12, 17 and 22) connected to the main amplifiers; and an enable signal generating circuit (Q6, /LMAE in FIGS. 11, 16 and 21, and SW in FIGS. 12, 17 and 22) for outputting a main amplifier enable signal to the enable signal line. The enable signal generating circuit is placed in close proximity to the connection circuits.

A semiconductor storage device according to a second aspect of the present invention comprises: a memory cell array (MCA in FIG. 21) having a plurality of memory cells (MC in FIGS. 11, 16 and 21); sense amplifiers (SA in FIG. 21), which are arranged adjacent to the memory cell array, for amplifying signals that have been read out of corresponding ones of the memory cells; readout signal lines (GDL, /GDL in FIG. 23); connection circuits (Q5, /LDL in FIG. 21, and SW in FIG. 23) for selectively connecting the sense amplifiers and the readout signal lines; a plurality of main amplifiers (MA in FIG. 23) for amplifying and outputting signals that have been read out of the sense amplifiers via the readout signal lines by the connection circuits selected by selection signals (YS in FIG. 21); a reference signal line (REF in FIG. 23) connected to the main amplifiers; and a reference signal generating circuit (Q7, LREF in FIG. 21 and SW in FIG. 22) for outputting a main amplifier reference signal to the reference signal line. The reference signal generating circuit is placed in close proximity to the connection circuits. In the following, exemplary embodiments will be disclosed with reference to the drawings, which should be understood not restrictive, and by way of example(s).

[Exemplary Embodiment 1]

Figure 1:
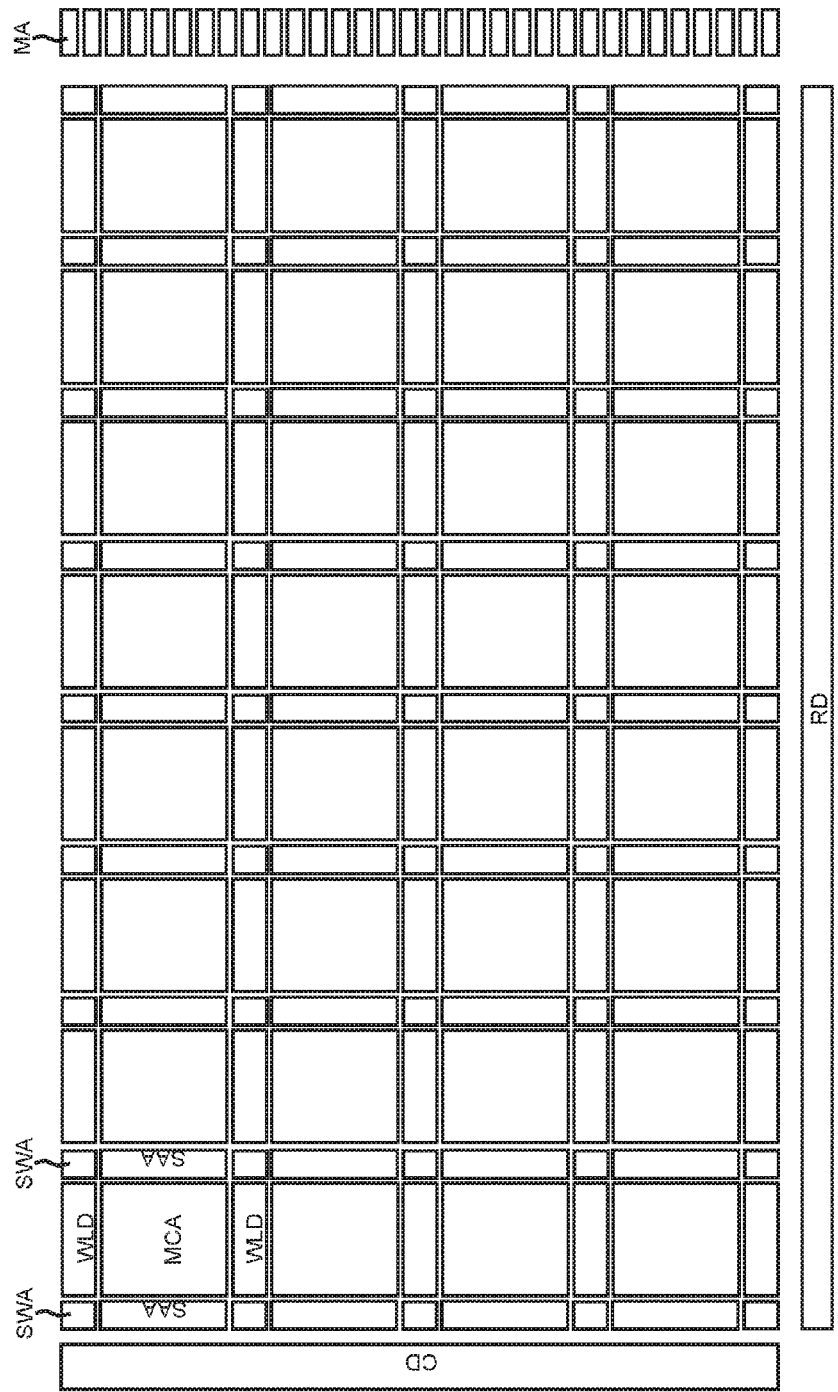
FIG. 1 is an overall block diagram schematically illustrating the configuration of a semiconductor storage device according to Exemplary Embodiment 1 of the present invention.
Figure 2:
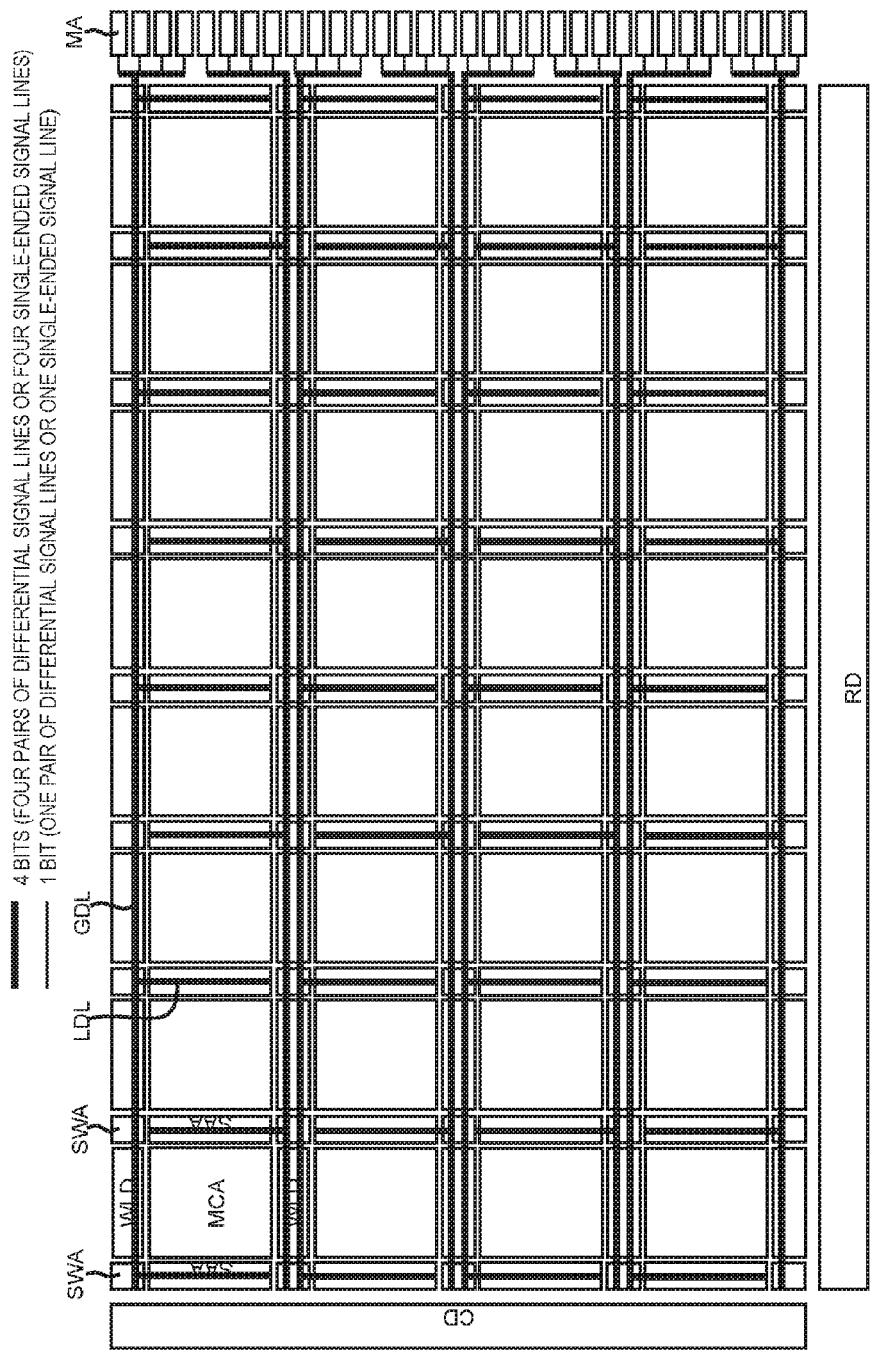
FIG. 2 is a diagram schematically illustrating paths of readout data in a semiconductor storage device according to Exemplary Embodiment 1 of the present invention.
Figure 3:
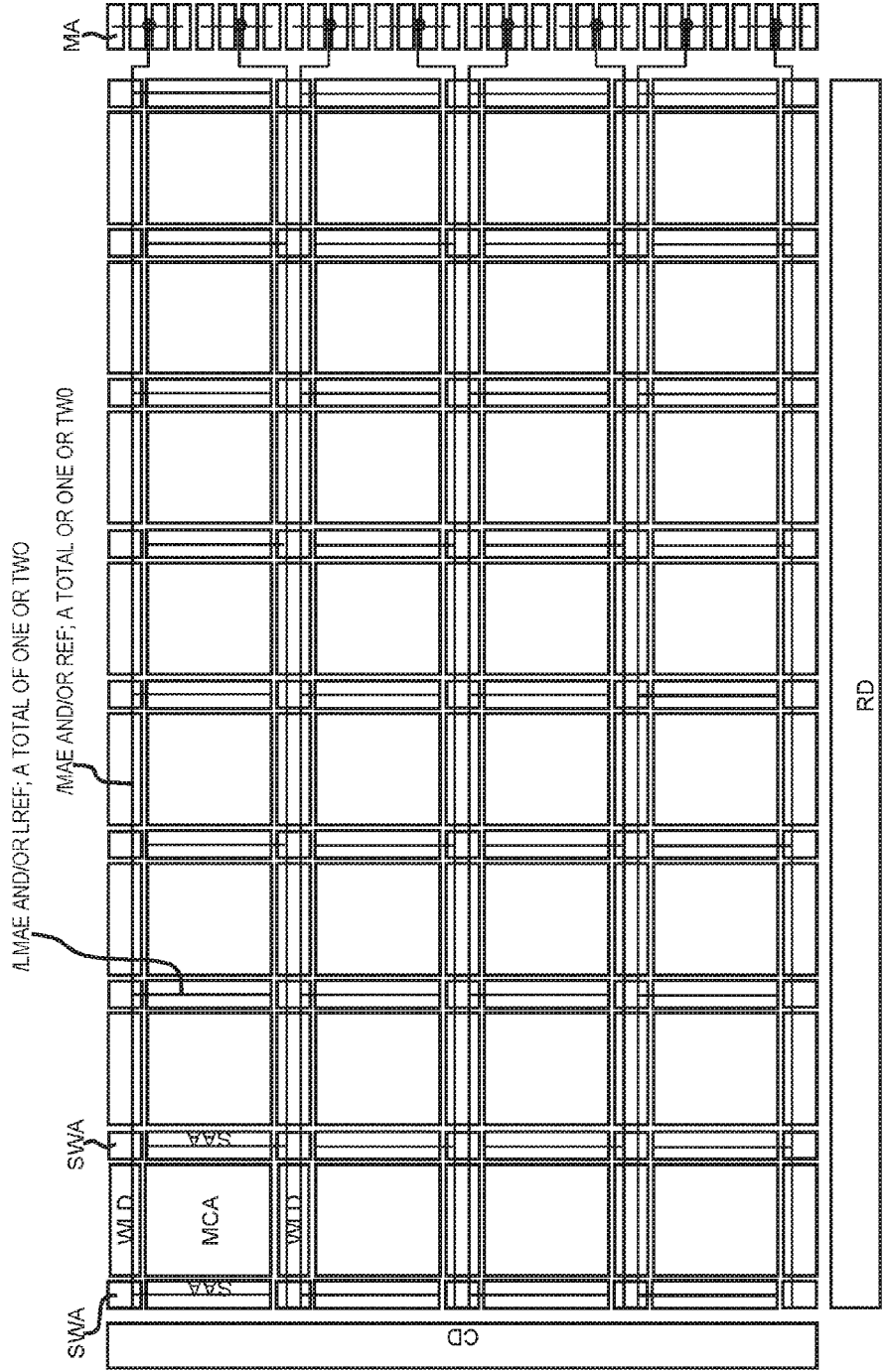
FIG. 3 is a diagram schematically illustrating paths of a main amplifier enable signal and/or reference signal in a semiconductor storage device according to Exemplary Embodiment 1 of the present invention.
Figure 4:
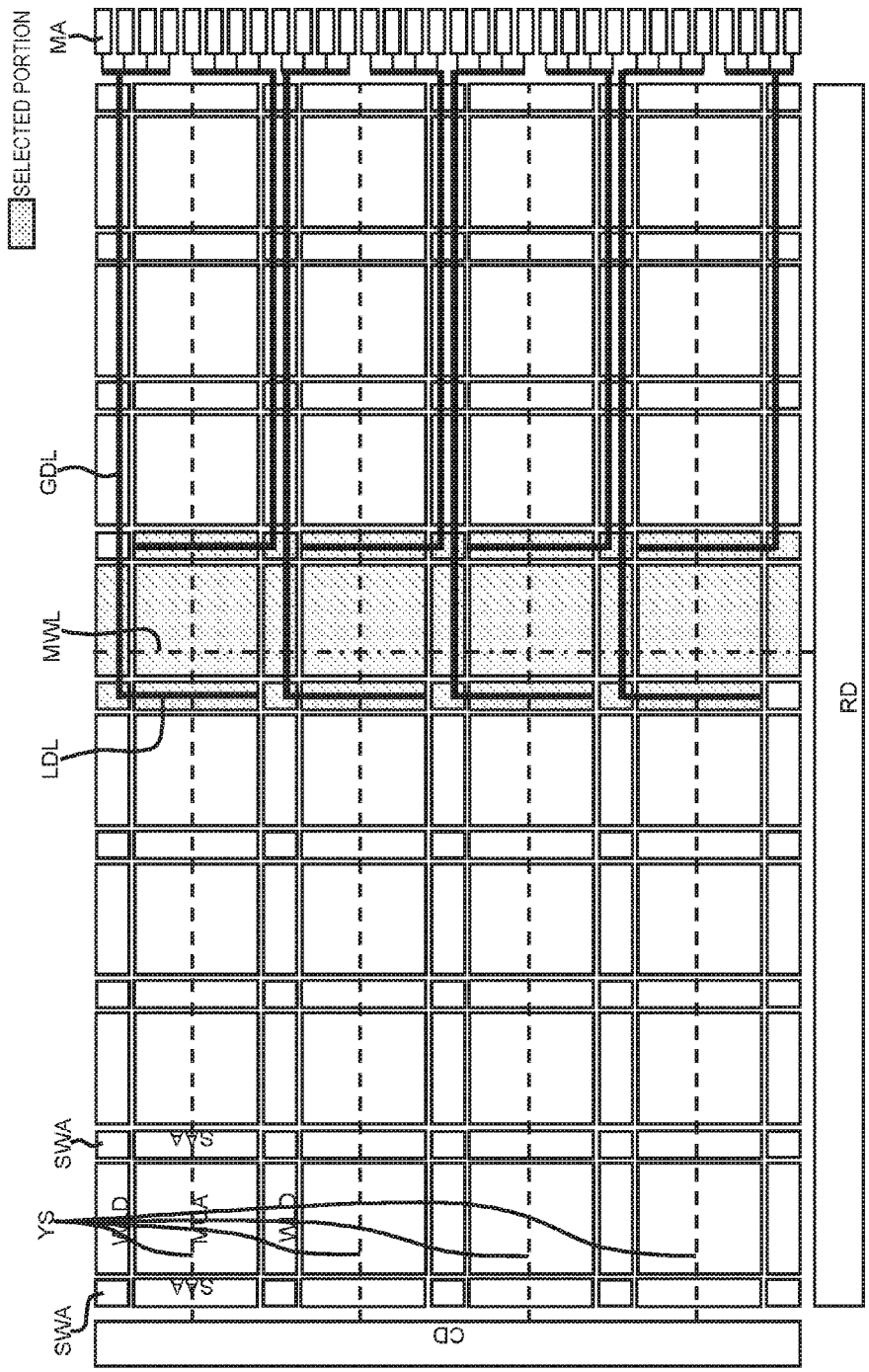
FIG. 4 is a diagram schematically illustrating paths of readout data from selected memory cell arrays to main amplifiers in a semiconductor storage device according to Exemplary Embodiment 1 of the present invention.
Figure 5:
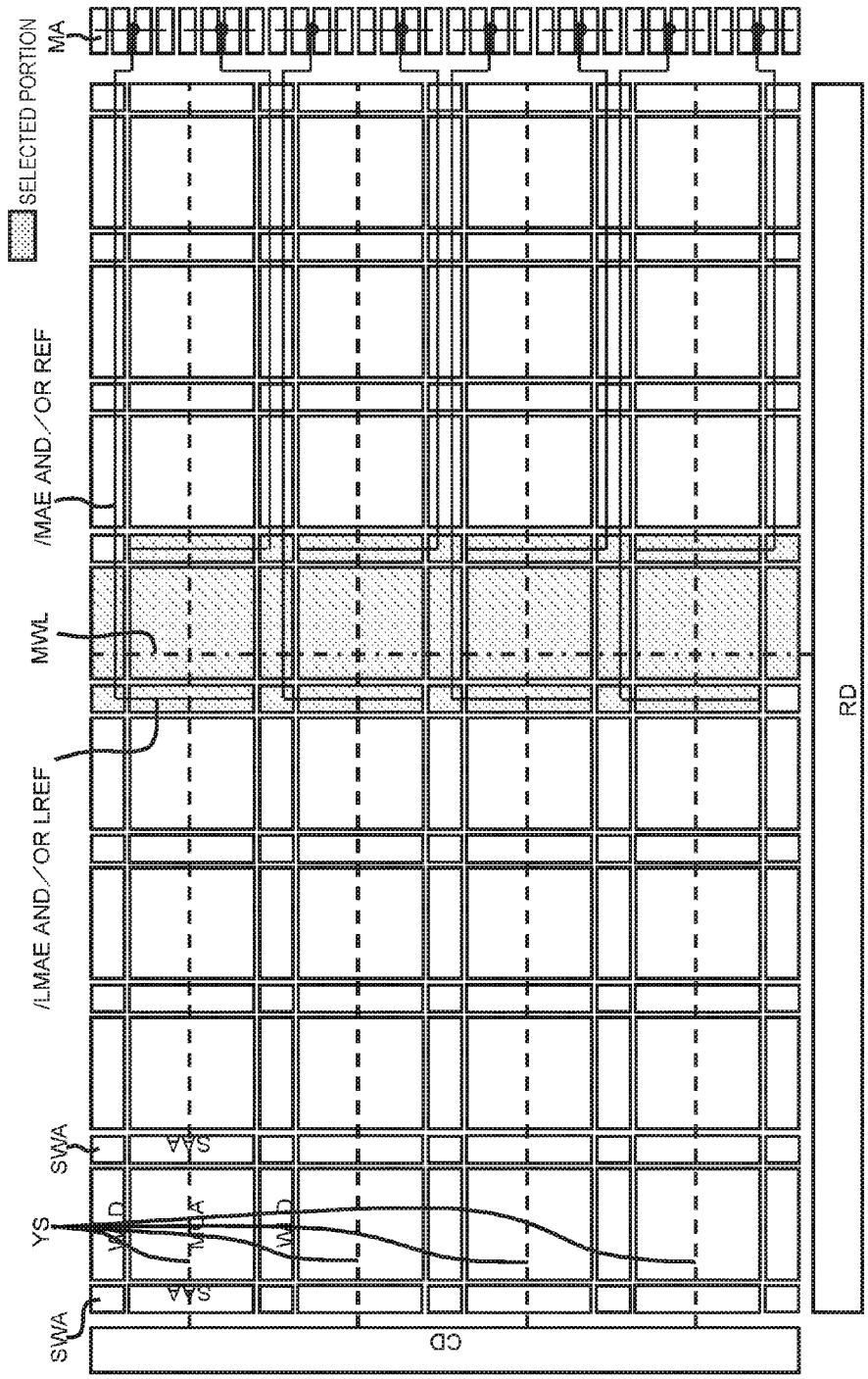
FIG. 5 is a diagram schematically illustrating paths of a main amplifier enable signal line and/or reference signal line from selected memory cell arrays to main amplifiers in a semiconductor storage device according to Exemplary Embodiment 1 of the present invention.

A semiconductor storage device according to Exemplary Embodiment 1 of the present invention will now be described with reference to the drawings, in which FIG. 1 is an overall block diagram schematically illustrating the configuration of a semiconductor storage device according to Exemplary Embodiment 1 of the present invention, FIG. 2 is a diagram schematically illustrating paths of readout data in a semiconductor storage device according to Exemplary Embodiment 1 of the present invention, FIG. 3 is a diagram schematically illustrating paths of a main amplifier enable signal and/or reference signal in a semiconductor storage device according to Exemplary Embodiment 1 of the present invention, FIG. 4 is a diagram schematically illustrating paths of readout data from selected memory cell arrays to main amplifiers in a semiconductor storage device according to Exemplary Embodiment 1 of the present invention, and FIG. 5 is a diagram schematically illustrating paths of a main amplifier enable signal line and/or reference signal line from selected memory cell arrays to main amplifiers in a semiconductor storage device according to Exemplary Embodiment 1 of the present invention.

With reference to FIG. 1, the semiconductor storage device according to Exemplary Embodiment 1 includes memory cell arrays MCA arranged in the form of a 4 row×8 column matrix. In memory cell array MCA, a plurality of memory cells (which correspond to MC in FIGS. 11, 16 and 21), which hold one bit of information comprising a 0 or a 1 as the minimum unit of information, are arranged in the form of a matrix. The details of the memory cell array MCA will be described in Embodiments 3 to 5.

Wordline drivers WLD are disposed at upper and lower sides of one memory cell array MCA. The wordline drivers WLD are circuits for driving corresponding wordlines (which correspond to WL in FIGS. 11, 16 and 21). It should be noted that wordlines (which correspond to WL in FIGS. 11, 16 and 21) wired in a plurality of columns within the memory cell array MCA are driven alternatingly by the upper and lower wordline drivers WLD, although this does not constitute any particular limitation. Further, in Exemplary Embodiment 1, each wordline driver WLD embraced by two adjacent memory cell arrays MCA is shared by each of the memory cell arrays MCA on both sides.

Sense amplifier areas SAA are disposed on left and right sides of one memory cell array MCA. Each sense amplifier area SAA has a plurality of sense amplifiers (which correspond to SA in FIGS. 11, 16 and 21) for amplifying, to a logic level, signals (data) that have been read out of selected memory cells (which correspond to MC in FIGS. 11 16 and 21) through bitlines (which correspond to BL, /BL in FIGS. 11, 16 and 21). It should be noted that the bitlines (which correspond to BL, /BL in FIGS. 11, 16 and 21) wired in a plurality of rows within the memory cell array MCA are connected alternatingly to the sense amplifier areas SAA on the left and right, although this does not constitute any particular limitation. Further, in Exemplary Embodiment 1, each sense amplifier area SAA embraced by two adjacent memory cell arrays MCA is shared by each of the memory cell arrays MCA on both sides. The details of the sense amplifier area SAA will be described in Embodiments 3 to 5.

Switch areas SWA are disposed in areas where the sense amplifier areas SAA intersect the wordline drivers WLD. Arranged in each switch area SWA are a plurality of switches (which correspond to SW in FIGS. 12, 17 and 22) that selectively connect local data lines (which correspond to LDL, /LDL in FIGS. 2, 12, 17 and 22) (described later) and global data lines (which correspond to GDL, /GDL in FIGS. 2, 12, 17 and 22) (described later).

A row decoder RD is disposed on the lower side of the overall area of the memory cell array block (the memory cell arrays MCA, wordline drivers WLD, sense amplifier areas SAA and switch areas SWA). The row decoder RD drives the wordline drivers WLD by row selection lines (which correspond to MWL in FIG. 4) (described later) and selects wordlines (which correspond to WL in FIGS. 11, 16 and 21).

A column decoder CD is disposed on the left side of the overall area of the memory cell array block. The column decoder CD controls selection of the sense amplifier areas SAA by column selection lines (which correspond to YS in FIG. 4) (described later).

Further, 32 main amplifiers MA are disposed on the right side of the overall area of the memory cell array block. The main amplifiers MA amplify and output readout data of memory cells (which correspond to MC in FIGS. 11, 16 and 21) read out via local data lines (which correspond to LDL, /LDL in FIGS. 2, 12, 17 and 22) (described later) and global data lines (which correspond to GDL, /GDL in FIGS. 2, 12, 17 and 22) (described later). The details of the main amplifiers MA will be described in Embodiments 3 to 5.

With reference to FIG. 2, local data line LDL is wired (i.e. routed) within sense amplifier area SAA. The local data line LDL is a signal line which, when a corresponding sense amplifier (which corresponds to SA in FIGS. 11, 16 and 21) in the sense amplifier area SAA has been selected, transmits the signal amplified by this sense amplifier to switch area SWA. Local data line LDL is connected in switch area SWA to global data line GDL disposed within wordline driver WLD on the upper or lower side of memory cell array MCA. Global data line GDL is a readout signal line which, when a corresponding switch (which corresponds to SW in FIGS. 12, 17 and 22) in switch area SWA has been selected, transmits the signal from the corresponding local data line LDL to main amplifier MA through this switch. Although there is no particular limitation, local data line LDL and global data line GDL are each arranged and bundled as four bitlines and, are each led out to the location where main amplifiers MA are situated and are (each) connected to (a group or set of) main amplifiers MA. Further, 1-bit data is transmitted on two signal lines in case of differential signals and on one signal line in case of a single-ended signal.

In FIG. 3, taking the same path as that of the data lines (LDL, GDL) of FIG. 2, main amplifier enable signal /MAE (where "/" indicates a negative logic signal here and throughout this specification) and/or a reference signal REF starts from within sense amplifier area SAA, goes through local main amplifier enable signal line /LMAE and/or local reference signal line LREF via switch area SWA, then through main amplifier enable signal line /MAE and/or reference signal line REF within wordline driver WLD on the upper or lower side of memory cell array MCA, is led out to the location where main amplifiers MA are situated and is input to the main amplifiers MA.

With reference to FIG. 4, a case where four memory cell arrays MCA in the fifth column from the left have been selected is illustrated. One row selection line MWL and a total of four column selection lines YS (namely one for every memory cell array MCA) have been selected. Here 8-bit data is read out of each selected memory cell array MCA. Among these eight bits, four bits are transferred to main amplifiers MA from local data lines LDL within the left-side sense amplifier area SAA via global data lines GDL on the upper side of the corresponding memory cell array MCA. The remaining four bits are transferred to main amplifiers MA from local data lines LDL within the right-side sense amplifier area SAA via global data lines GDL on the lower side of the corresponding memory cell array MCA. Accordingly, a total of 32 bits of data are read out of four memory cell arrays MCA and the data is transferred to corresponding ones of 32 main amplifiers MA.

With reference to FIG. 5, a signal (/MAE and/or REF) corresponding to data read out of the local data line (LDL in FIG. 4) within sense amplifier area SAA on the left side of each selected memory cell array MCA follows a path (/LMAE and/or LREF) the same as that of the corresponding local data line (LDL in FIG. 4) and is transferred to the corresponding main amplifiers MA via a path (/MAE and/or REF) the same as that of the global data line (GDL in FIG. 4) on the upper side of the memory cell array MCA. On the other hand, a signal (/MAE and/or REF) corresponding to data read out of the local data line (LDL in FIG. 4) within sense amplifier area SAA on the right side follows a path (/LMAE and/or LREF) the same as that of the corresponding local data line (LDL in FIG. 4) and is transferred to the corresponding (a set or group of) main amplifiers MA via a path (/MAE and/or REF) the same as that of the global data line (GDL in FIG. 4) on the lower side of the memory cell array MCA. Accordingly, the data that is transferred to the main amplifiers MA, the main amplifier enable signal MAE that enables these main amplifiers MA and the reference signal REF are transferred from sense amplifier area SAA to the main amplifiers MA via the same path.

In accordance with Exemplary Embodiment 1, in a semiconductor storage device, such as a DRAM, having a large-scale memory array block, when readout data is transferred from a plurality of sense amplifier areas SAA distributed within the memory cell array block to corresponding (a set or group of) main amplifiers MA and the transferred readout data is amplified by the main amplifiers MA, the enable timing of the main amplifiers MA and the transfer timing of the readout data can always be made to coincide. As a result, the operating margin of the semiconductor storage device can be improved and high-speed readout can be achieved. Further, the transfer timings of the readout reference signal REF and readout data of the main amplifiers MA can always be made to coincide. As a result, even if the readout data is transferred by a single-ended arrangement, the data can be amplified as differential signals by (a set or group of) the main amplifiers MA. This means that the number of readout data lines can be halved and chip area is reduced while the operating margin of the semiconductor storage device is assured.

[Exemplary Embodiment 2]

Figure 6:
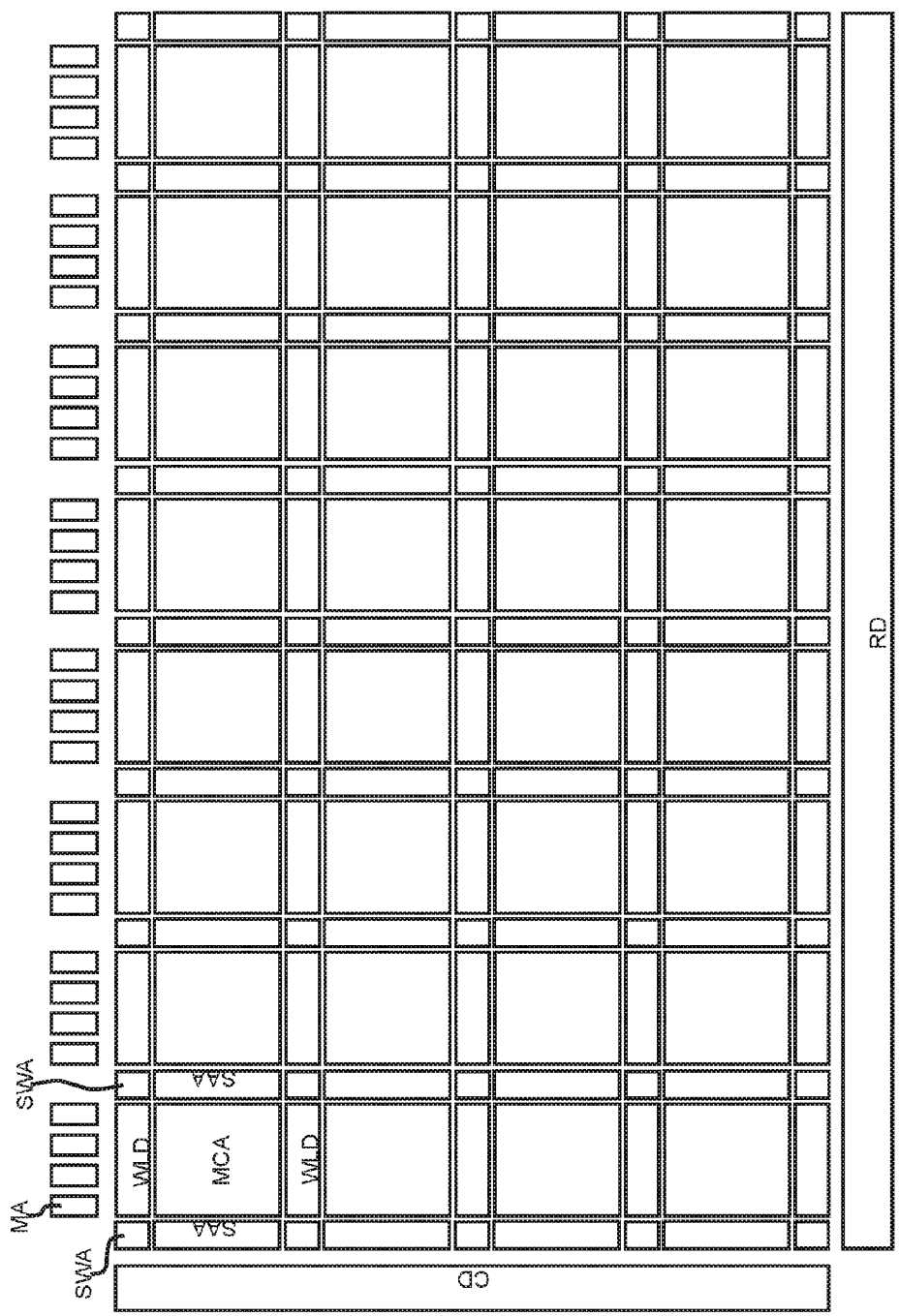
FIG. 6 is an overall block diagram schematically illustrating the configuration of a semiconductor storage device according to Exemplary Embodiment 2 of the present invention.
Figure 7:
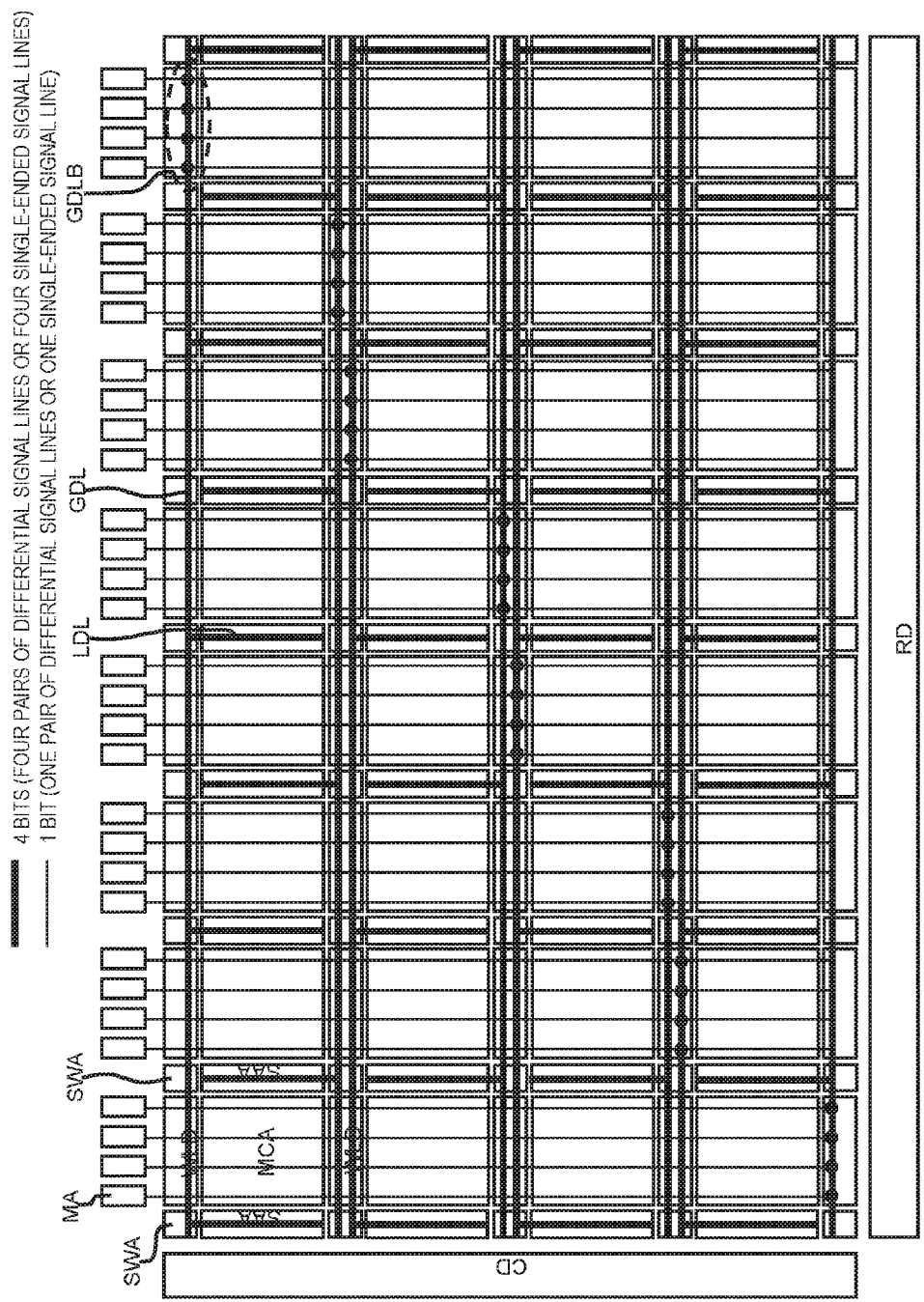
FIG. 7 is a diagram schematically illustrating paths of readout data in a semiconductor storage device according to Exemplary Embodiment 2 of the present invention.
Figure 8:
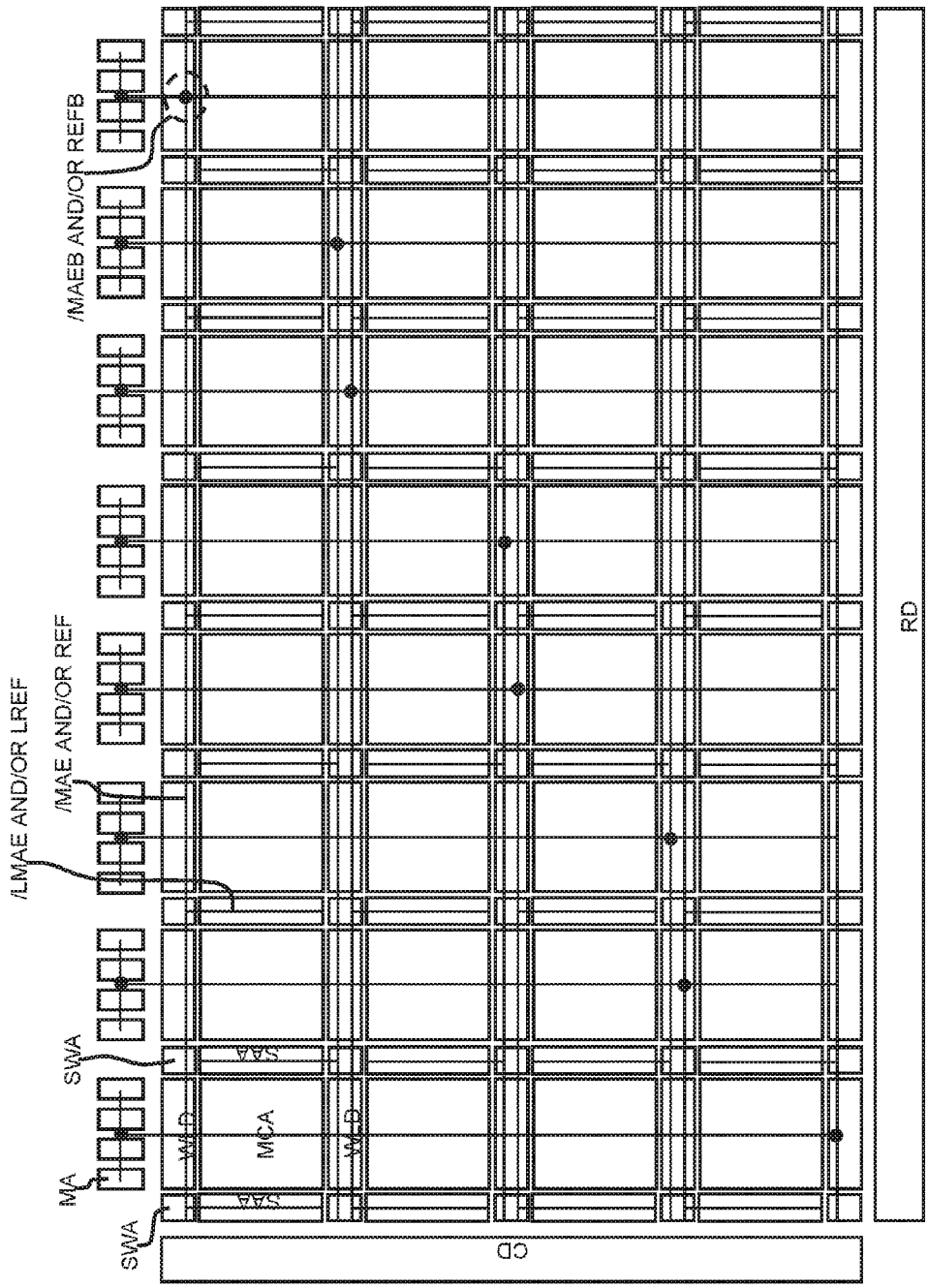
FIG. 8 is a diagram schematically illustrating paths of a main amplifier enable signal line and/or reference signal line in a semiconductor storage device according to Exemplary Embodiment 2 of the present invention.
Figure 9:
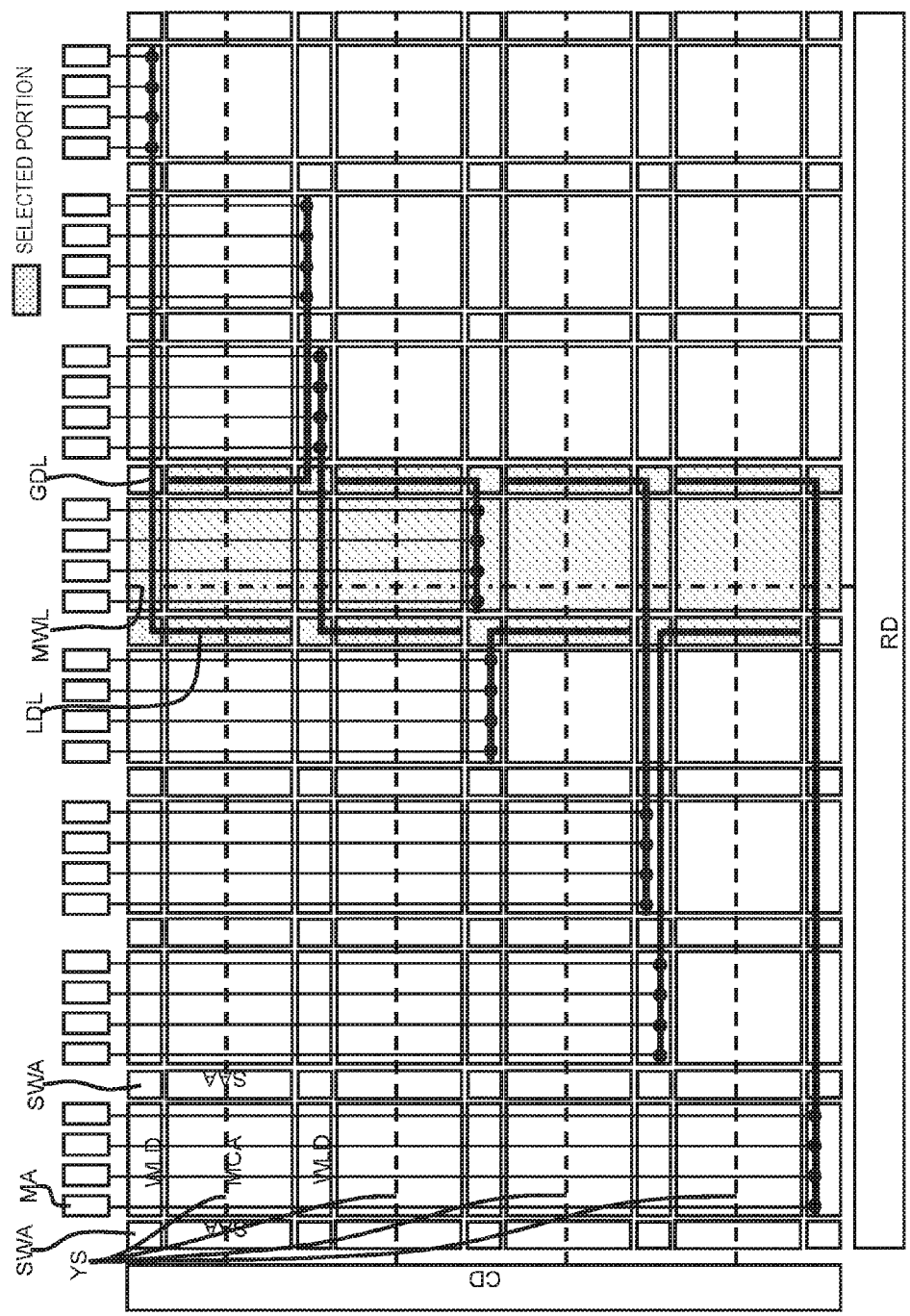
FIG. 9 is a diagram schematically illustrating paths of readout data from selected memory cell arrays to main amplifiers in a semiconductor storage device according to Exemplary Embodiment 2 of the present invention.
Figure 10:
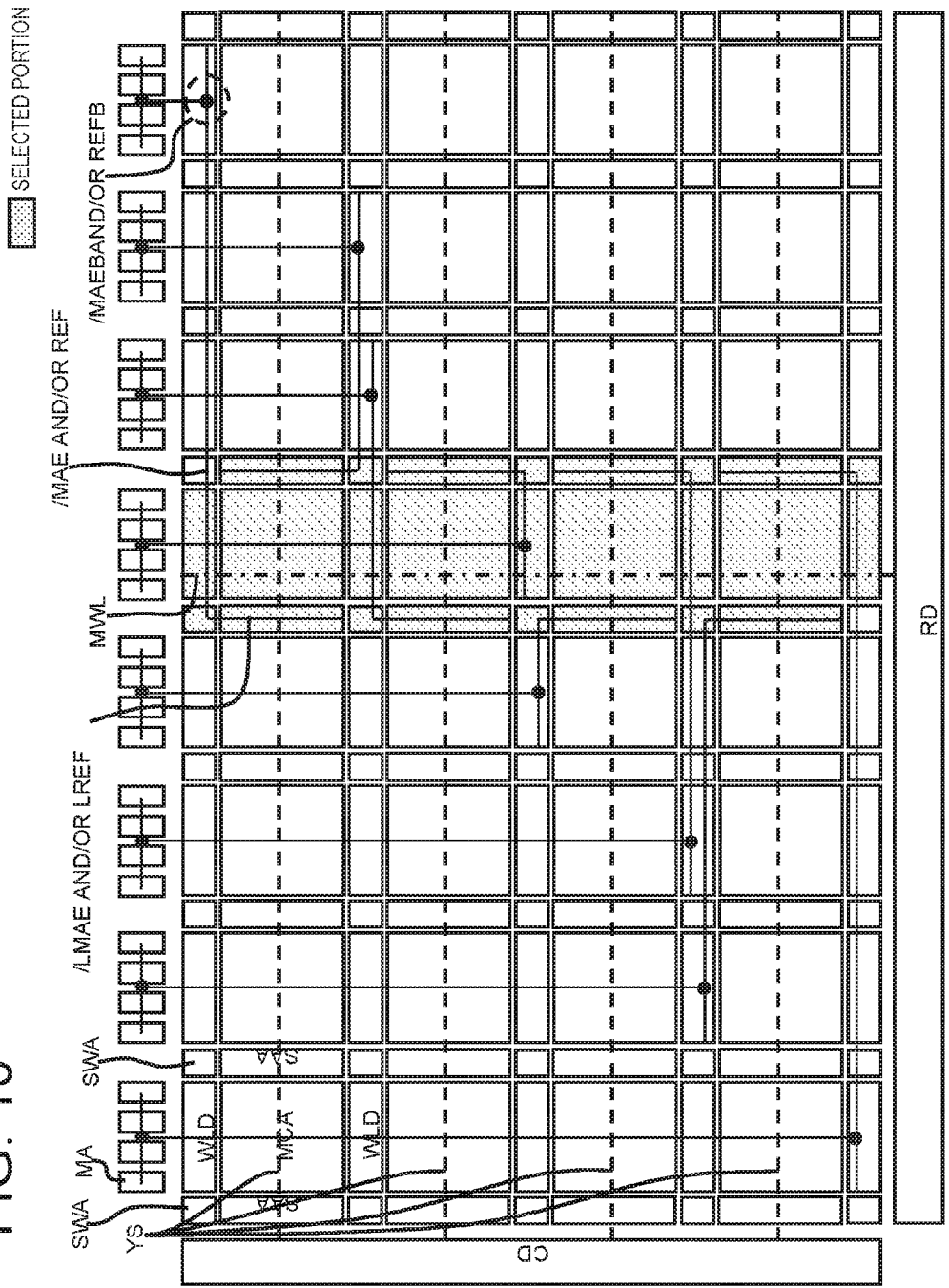
FIG. 10 is a diagram schematically illustrating paths of a main amplifier enable signal line and/or reference signal line from selected memory cell arrays to main amplifiers in a semiconductor storage device according to Exemplary Embodiment 2 of the present invention.

A semiconductor storage device according to Exemplary Embodiment 2 of the present invention will now be described with reference to the drawings, in which FIG. 6 is an overall block diagram schematically illustrating the configuration of a semiconductor storage device according to Exemplary Embodiment 2 of the present invention; FIG. 7 is a diagram schematically illustrating paths of readout data in a semiconductor storage device according to Exemplary Embodiment 2 of the present invention; FIG. 8 is a diagram schematically illustrating paths of a main amplifier enable signal line and/or reference signal line in a semiconductor storage device according to Exemplary Embodiment 2 of the present invention; FIG. 9 is a diagram schematically illustrating paths of readout data from selected memory cell arrays to main amplifiers in a semiconductor storage device according to Exemplary Embodiment 2 of the present invention; and FIG. 10 is a diagram schematically illustrating paths of a main amplifier enable signal line and/or reference signal line from selected memory cell arrays to main amplifiers in a semiconductor storage device according to Exemplary Embodiment 2 of the present invention.

In Exemplary Embodiment 2, main amplifiers MA are arranged on the upper side of the area of the overall memory cell array block and the pattern of the global data lines GDL connected to the main amplifiers MA is changed. This embodiment is similar to Exemplary Embodiment 1 in other respects.

With reference to FIG. 6, 32 main amplifiers MA are arranged on the upper side of the area of the overall memory cell array block. The main amplifiers MA amplify and output readout data of memory cells read out via local data lines (which correspond to LDL, /LDL in FIGS. 7, 13, 18 and 23) (described later) and global data lines (which correspond to GDL, /GDL in FIGS. 7, 13, 18 and 23) (described later).

With reference to FIG. 7, global data line GDL disposed within wordline driver WLD on the upper or lower side of memory cell array MCA branches at a prescribed location (a portion corresponding to global data line branch portion GDLB) and is connected to main amplifiers MA upon passing over memory cell array MCA. Although there is no particular limitation, local data line LDL and global data line GDL are each arranged and bundled as four bitlines, branch into bitlines of one bit each at the global data line branch portion GDLB, are led out to the location(s) where main amplifiers MA are situated and are connected to these main amplifiers MA upon passing over memory cell array MCA. Further, although there is no particular limitation, the lengths of all of the global data lines GDL which branch at their tips preferably are made the same in such a manner that the parasitic capacitances thereof will be equal.

In FIG. 8, taking the same path as that of the data lines (LDL, GDL) of FIG. 7, main amplifier enable signal /MAE and/or reference signal REF starts from within sense amplifier area SAA, goes through local main amplifier enable signal line /LMAE and/or local reference signal line LREF via switch area SWA, then through main amplifier enable signal line /MAE and/or reference signal line REF within wordline driver WLD on the upper or lower side of memory cell array MCA, branches at a prescribed location(s) (main amplifier enable signal line branch portion /MAEB and/or reference signal line branch portion REFB) within wordline driver WLD, passes over the memory cell array MCA, is led out to the location(s) where main amplifiers MA are situated and is input to the main amplifiers MA. Further, although there is no particular limitation, the lengths of all of the main amplifier enable signal lines /MAE and/or reference signal lines REF which branch at their tips preferably are made the same in such a manner that the parasitic capacitances thereof will be equal, and the lengths of all the global data lines GDL which branch at their tips where they branch preferably are made the same.

With reference to FIG. 9, 8-bit data is read out of each selected memory cell array MCA. Among these eight bits, four bits branch from local data line LDL, within the left-side sense amplifier area SAA, at a prescribed location on global data line GDL on the upper side of the corresponding memory cell array MCA and are transferred to main amplifiers MA upon passing over memory cell array MCA. The remaining four bits branch from local data line LDL, within the right-side sense amplifier area SAA, at a prescribed location on global data line GDL on the lower side of the corresponding memory cell array MCA and are transferred to main amplifiers MA upon passing over memory cell array MCA.

With reference to FIG. 10, a signal (/MAE and/or REF) corresponding to data read out of local data line LDL within sense amplifier area SAA on the left side of each selected memory cell array MCA follows a path (/LMAE and/or LREF) the same as that of the corresponding local data line (LDL in FIG. 9), follows a path (/MAE and/or REF) the same as that of the global data line (GDL in FIG. 9) on the upper side of memory cell array MCA, branches at a prescribed location(s) (/MAEB and/or REFB) on the global data line (GDL in FIG. 9) and is transferred to the corresponding main amplifiers MA. On the other hand, a signal (/MAE and/or REF) corresponding to data read out of the local data line (LDL in FIG. 9) within the right-side sense amplifier area SAA follows a path (/LMAE and/or LREF) the same as that of the corresponding local data line (LDL in FIG. 9), follows a path (/MAE and/or REF) the same as that of the global data line (GDL in FIG. 9) on the lower side of memory cell array MCA, branches at a prescribed location(s) (/MAEB and/or REFB) on the global data line GDL and is transferred to the (a set or group of) corresponding main amplifiers MA. Accordingly, the data that is transferred to the main amplifiers MA, the main amplifier enable signal /MAE that enables these main amplifiers MA and the reference signal REF are transferred from sense amplifier area SAA to the main amplifiers MA via the same path.

In accordance with Exemplary Embodiment 2, in a semiconductor storage device, such as a DRAM, having a large-scale memory array block, when readout data is transferred from a plurality of sense amplifier areas SAA distributed within the memory cell array block to corresponding main amplifiers MA and the transferred readout data is amplified by the main amplifiers MA, the enable timing of the main amplifiers MA and the transfer timing of the readout data can always be made to coincide. As a result, the operating margin of the semiconductor storage device can be improved and high-speed readout can be achieved. Further, the transfer timings of the readout reference signal REF and readout data of the main amplifiers MA can always be made to coincide. As a result, even if the readout data is transferred by a single end, the data can be amplified as differential signals by the main amplifiers MA. This means that the number of readout data lines can be halved and chip area is reduced while the operating margin of the semiconductor storage device is assured.

[Exemplary Embodiment 3]

Figure 11:
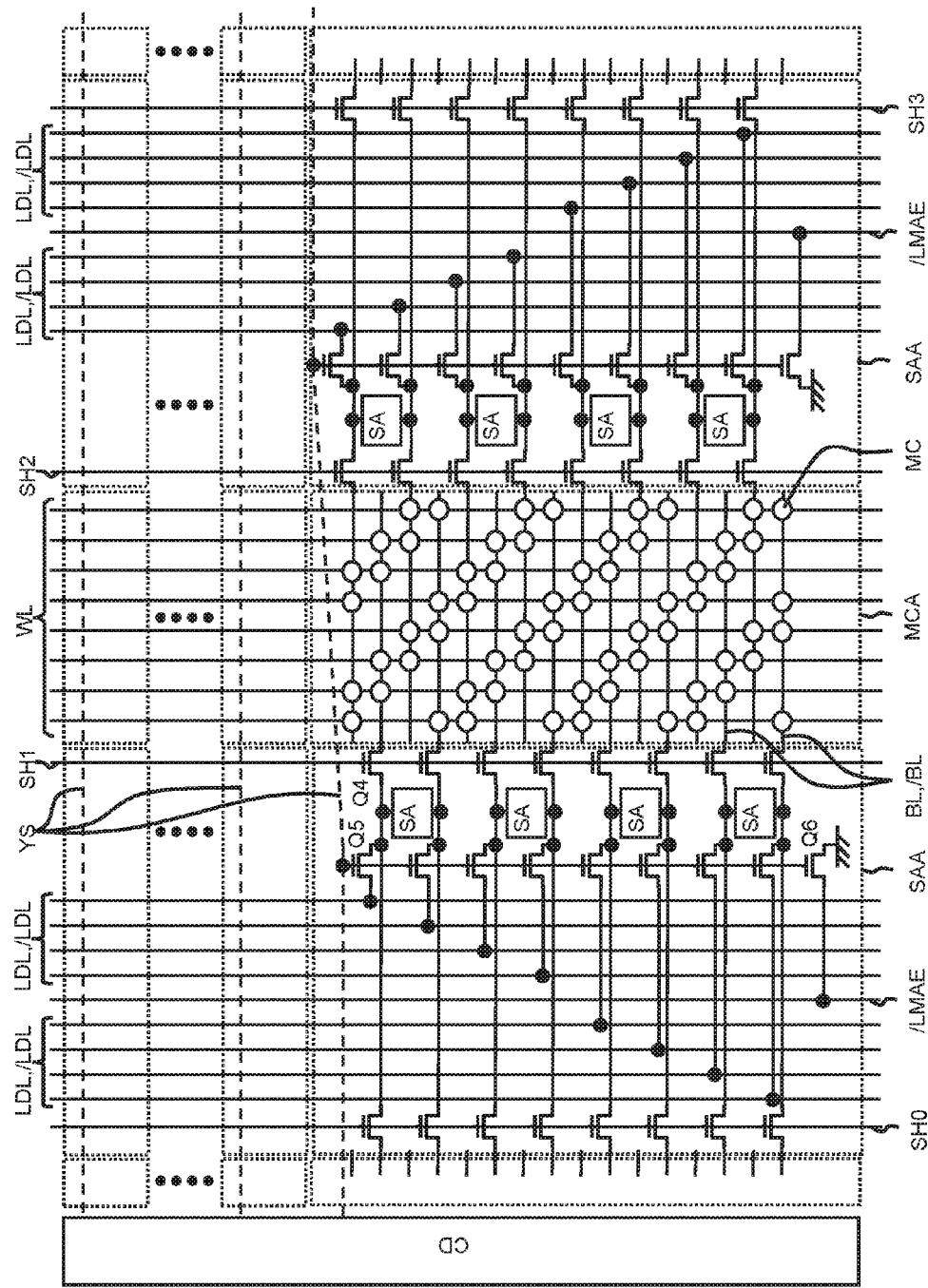
FIG. 11 is a circuit diagram schematically illustrating a memory cell array and sense amplifier areas in a semiconductor storage device according to Exemplary Embodiment 3 of the present invention.
Figure 12:
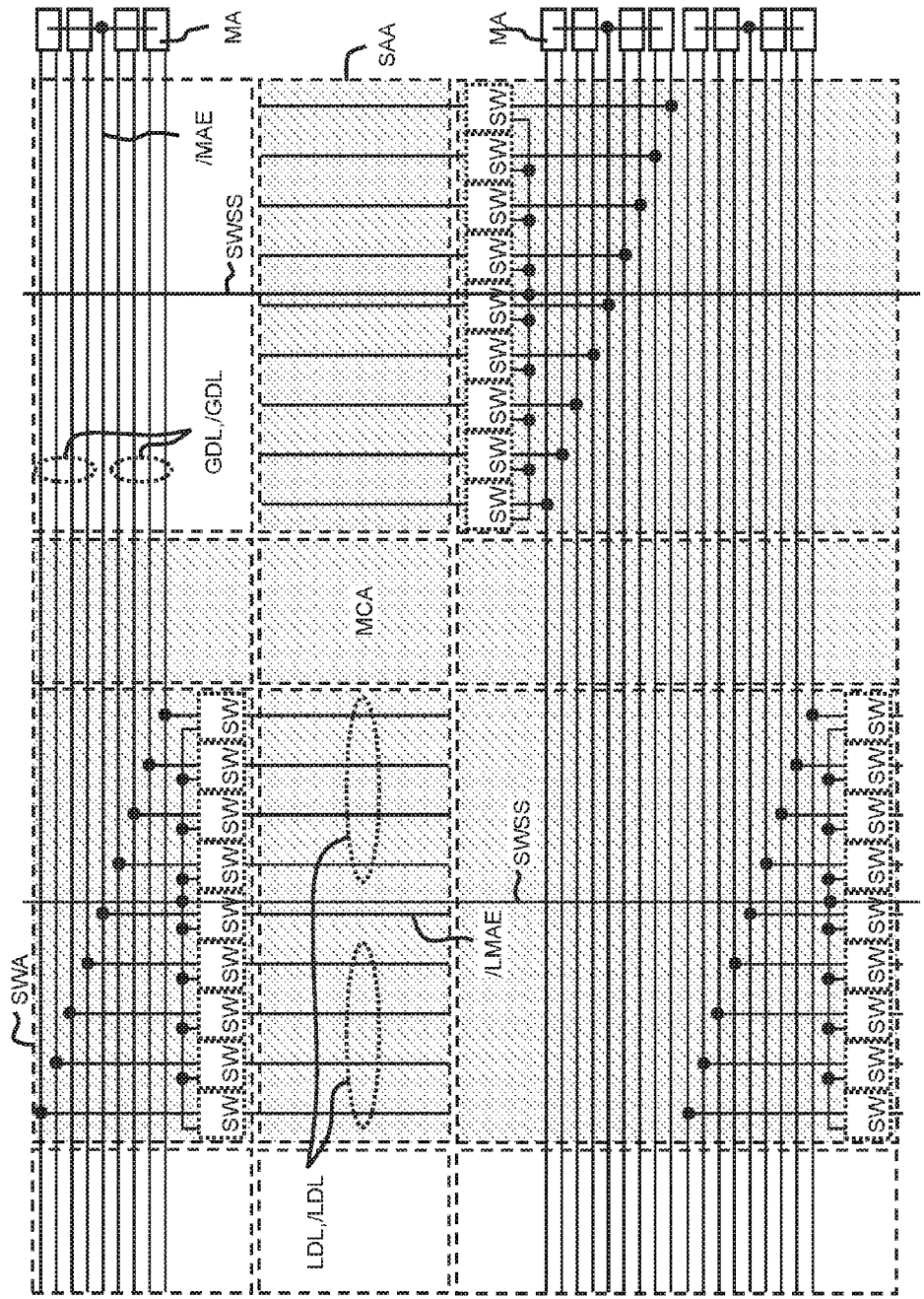
FIG. 12 is a circuit diagram schematically illustrating the configuration of a switch area in a semiconductor storage device according to Exemplary Embodiment 3-1 of the present invention (in which the memory cell array and sense amplifier areas according to Exemplary Embodiment 3 are applied to Exemplary Embodiment 1)
Figure 13:
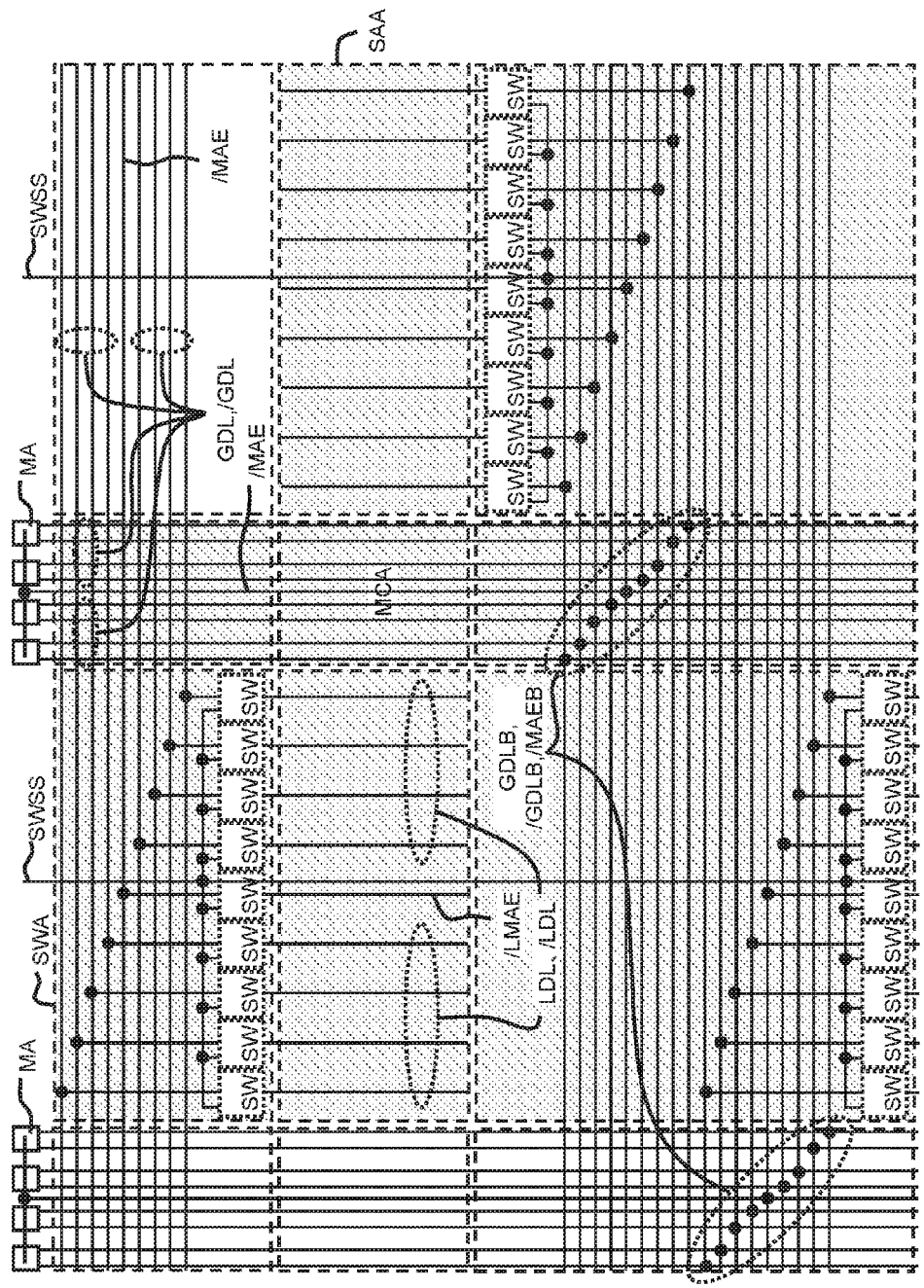
FIG. 13 is a circuit diagram schematically illustrating the configuration of a switch area in a semiconductor storage device according to Exemplary Embodiment 3-2 of the present invention (in which the memory cell array and sense amplifier areas according to Exemplary Embodiment 3 are applied to Exemplary Embodiment 2)
Figure 14:
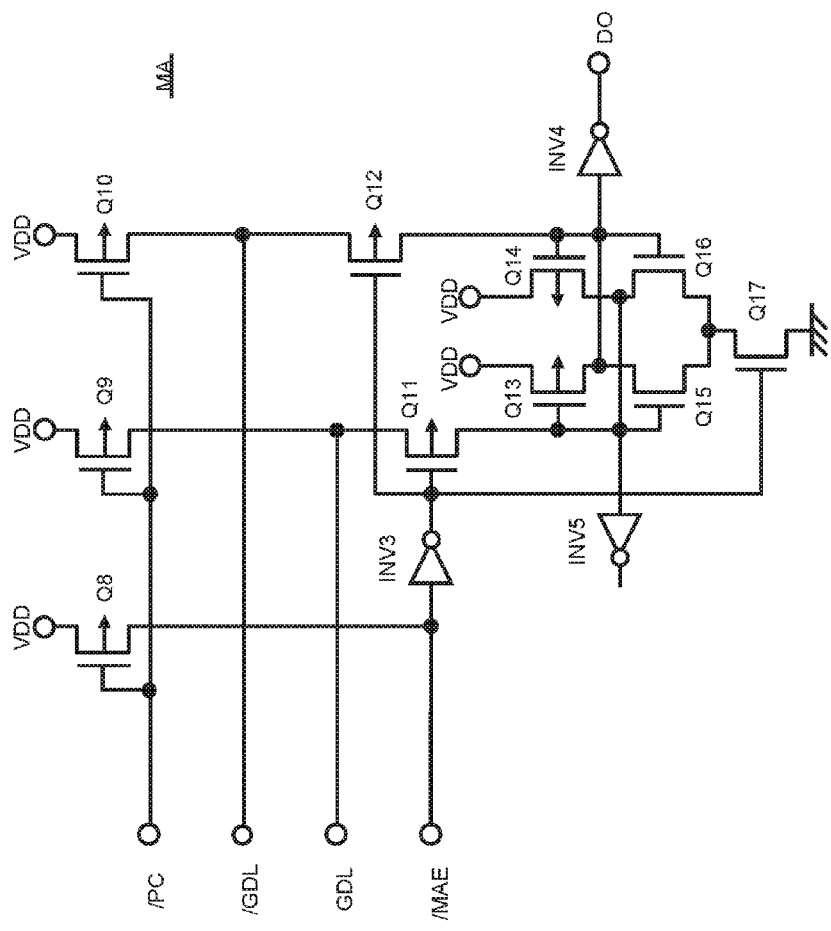
FIG. 14 is a circuit diagram schematically illustrating the configuration of a main amplifier in a semiconductor storage device according to Exemplary Embodiment 3 of the present invention.
Figure 15:
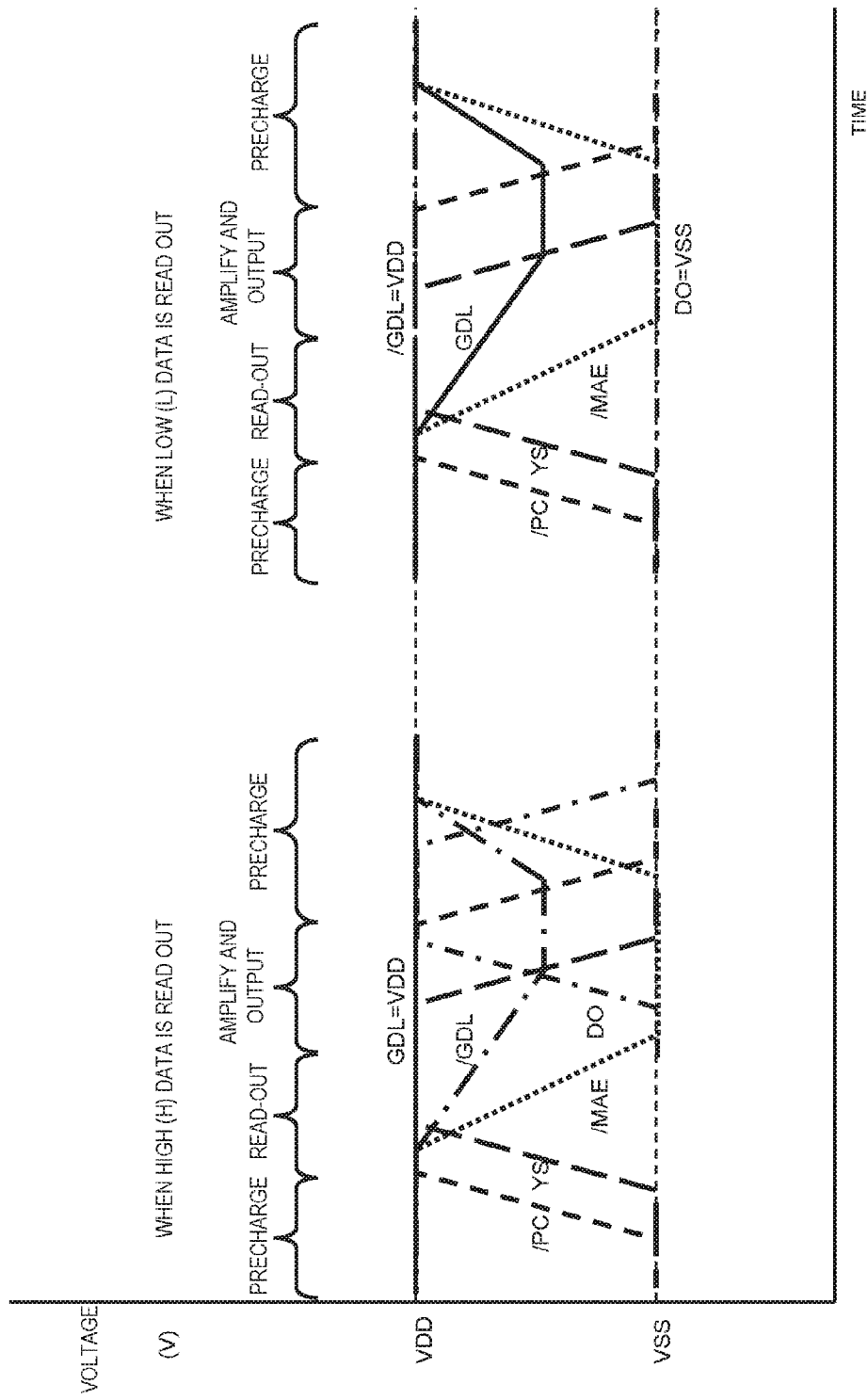
FIG. 15 is a timechart schematically illustrating the operation waveforms of a main amplifier in a semiconductor storage device according to Exemplary Embodiment 3 of the present invention.

A semiconductor storage device according to Exemplary Embodiment 3 of the present invention will now be described with reference to the drawings, in which FIG. 11 is a circuit diagram schematically illustrating a memory cell array and sense amplifier areas in a semiconductor storage device according to Exemplary Embodiment 3 of the present invention, FIG. 12 is a circuit diagram schematically illustrating the configuration of a switch area(s) in a semiconductor storage device according to Exemplary Embodiment 3-1 of the present invention (in which the memory cell array and sense amplifier areas according to Exemplary Embodiment 3 are applied to Exemplary Embodiment 1), FIG. 13 is a circuit diagram schematically illustrating the configuration of a switch area(s) in a semiconductor storage device according to Exemplary Embodiment 3-2 of the present invention (in which the memory cell array and sense amplifier areas according to Exemplary Embodiment 3 are applied to Exemplary Embodiment 2), FIG. 14 is a circuit diagram schematically illustrating the configuration of a main amplifier in a semiconductor storage device according to Exemplary Embodiment 3 of the present invention, and FIG. 15 is a timechart schematically illustrating the operation waveforms of a main amplifier in a semiconductor storage device according to Exemplary Embodiment 3 of the present invention.

The third embodiment illustrates in detail an example of the configuration of memory cell array MCA, sense amplifier area SAA and main amplifier of Embodiments 1 and 2. Exemplary Embodiment 3 deals with a double-ended arrangement in which LDL, /LDL are adopted as local data lines, GDL, /GDL as global data lines and BL, /BL as bitlines.

With reference to FIG. 11, a (each) memory cell MC is placed at the intersection of a wordline WL and one bitline of bitlines BL, /BL. Sense amplifier SA, column switch nMOS transistor Q5 and main amplifier enable signal generating nMOS transistor Q6 are shared by left and right memory cell arrays MCA. In response to receipt of a corresponding one of shared control signals SH0 to SH3 at its gate, switch nMOS transistor(s) Q4 selectively connects selected bitlines BL, /BL and sense amplifier SA. Upon receipt of column selection signal YS at its gate, column switch nMOS transistor(s) Q5 selectively connects the selected sense amplifier SA and local data lines LDL, /LDL. Main amplifier enable signal generating nMOS transistor Q6 is a circuit for generating main amplifier enable signal /MAE. Upon receipt of column selection signal YS at its gate, main amplifier enable signal generating nMOS transistor Q6, in synch with the timing at which the selected sense amplifier(s) SA is connected to local data lines LDL, /LDL, drives the main amplifier enable signal /MAE from the high level of the standby state to the low level of the active state via local main amplifier enable signal line /LMAE at proximate location. In Exemplary Embodiment 3, four sense amplifiers SA on each of left and right sides of memory cell array MCA, for a total of eight sense amplifiers SA, are selected by a single column selection signal YS.

In FIG. 12, which is a case (Exemplary Embodiment 3-1) where memory cell array MCA and sense amplifier areas SAA according to Exemplary Embodiment 3 of FIG. 11 are applied to Exemplary Embodiment 1, local data lines LDL, /LDL and global data lines GDL, /GDL are connected by corresponding switches SW by a switch selection signal SWSS corresponding to the selected memory cell array MCA. In addition, local main amplifier enable signal /LMAE in the area of local data lines LDL, /LDL and main amplifier enable signal /MAE in the area of global data lines GDL, /GDL are connected by corresponding switches SW.

Figure 26:
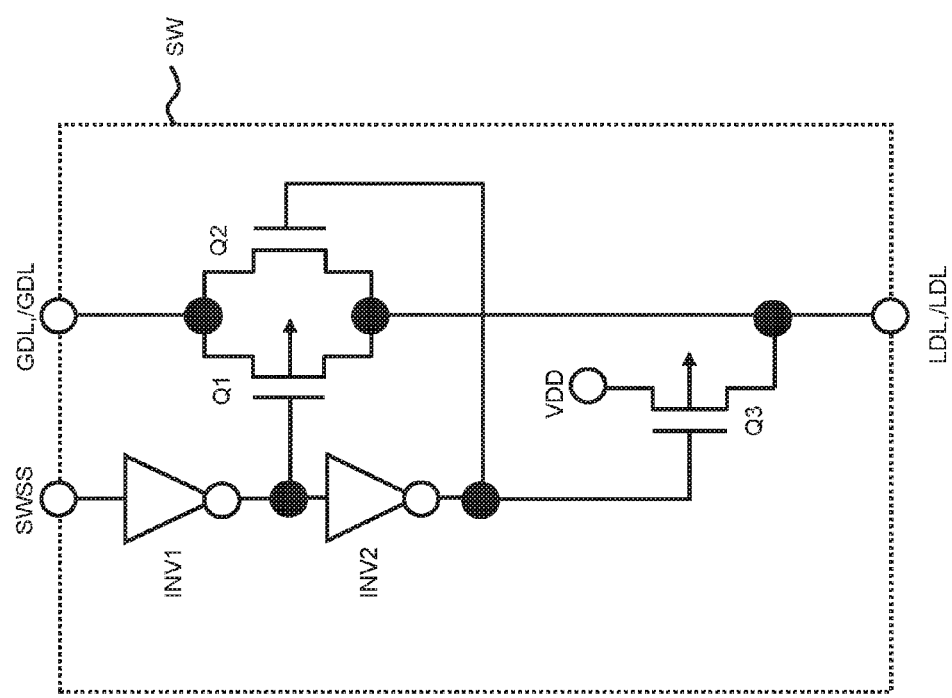
FIG. 26 is a circuit diagram schematically illustrating the configuration of a switch disposed in a switch area of a semiconductor storage device according to Embodiments 3 to 5 of the present invention.

A specific example of the circuit of switch SW is illustrated in FIG. 26. When the switch selection signal SWSS is at the high level of the selected state, pMOA transistor Q1 is turned on by a low level resulting from inversion by inverter INV1. Furthermore, nMOS transistor Q2 is turned on by a high level resulting from inversion by inverter INV2, and pMOS transistor Q3, which precharges the signal on the side of local data lines LDL, /LDL to power supply potential VDD, is turned off. As a result, precharging of the signal lines on the side of local data lines LDL, /LDL ends and the signal driven by the column selection signal (YS in FIG. 11) is transmitted to the global data lines GDL, /GDL.

In FIG. 13, which is a case (Exemplary Embodiment 3-2) where memory cell array MCA and sense amplifier areas SAA according to Exemplary Embodiment 3 of FIG. 11 are applied to Exemplary Embodiment 2, local data lines LDL, /LDL and global data lines GDL, /GDL are connected by switches SW by a switch selection signal SWSS corresponding to the selected memory cell array MCA. In addition, global data lines GDL, /GDL branch at a branch portion (GDLB, /GDLB) and are connected to main amplifiers MA. On the other hand, local main amplifier enable signal /LMAE in the area of local data lines LDL, /LDL and main amplifier enable signal /MAE in the area of global data lines GDL, /GDL are connected by corresponding switches SW, and main amplifier enable signal /MAE branches at a branch portion (/MAEB) and is connected to main amplifiers MA.

In a main amplifier (MA in FIGS. 12 and 13) shown in FIG. 14, in response to receipt of a precharge control signal /PC at their gates, pMOS transistors Q8, Q9, Q10 for precharging precharge global data lines GDL, /GDL and main amplifier enable signal /MAE to the power supply potential VDD while the precharge control signal /PC is at the low level. The main amplifier enable signal /MAE is inverted by an inverter INV3 and is then connected to the gates of isolation pMOS transistors Q11, Q12 and to the gate of a main amplifier activating nMOS transistor Q17. When the main amplifier enable signal /MAE falls to the low level and main amplifier MA is activated, the global data lines GDL, /GDL are cut off from the main amplifier (MA in FIGS. 12, 13), the main amplifier activating nMOS transistor Q17 turns on and a cross latch, which comprises pMOS transistors Q13, Q14 and nMOS transistors Q15, Q16, amplifies and latches differential readout signals that have entered from the global data lines GDL, /GDL. This result is inverted by an inverter INV4 and then output from an output terminal DO. It should be noted that an inverter INV5 is a dummy for balancing the parasitic capacitance of the input node of the cross latch.

With reference to FIG. 15, the left side illustrates a case where high (H) data is read out of a memory cell (MC in FIG. 11) and the right side a case where low (L) data is read out of a memory cell (MC in FIG. 11).

In case of readout of high data, first the precharge control signal /PC attains the high level at the end of the precharge interval. Then, when the column selection signal YS attains the high level in the readout interval, the global data line GDL is held as is at the high level, the global data line /GDL is driven toward the low-level side and a readout signal appears. At the same time, the main amplifier enable signal /MAE is driven to the low level. As a result, the main amplifier MA is activated, the output data DO attains the high level and high data is output. When the column selection signal YS falls to the low level, the global data line /GDL is driven no further toward the low level. Then, when the precharge interval starts, the precharge control signal /PC falls to the low level and the global data lines GDL, /GDL and main amplifier enable signal /MAE are precharged to the high level. Thereafter, the output data falls to the low level, thereby ending a series of readout operations.

In case of readout of low data, the global data line /GDL is held as is at the high level, the global data line GDL is driven toward the low-level side and a readout signal appears. As a result, the output data DO falls to the low level and low data is output. Operation in other respects is similar to that when high data is read out.

In accordance with Exemplary Embodiment 3, in a semiconductor storage device, such as a DRAM, having a large-scale memory cell array block, the main amplifier enable signal /MAE also is driven in the vicinity of the selected sense amplifier SA irrespective of which sense amplifier SA among sense amplifiers distributed within the memory cell array block is selected and read out. Consequently, the timing relationship between the readout signals of global data lines GDL, /GDL and main amplifier activation due to main amplifier enable signal /MAE, which signals are input to the main amplifier MA, is fixed, the operating margin of the main amplifier can be improved and high-speed readout can be achieved.

[Exemplary Embodiment 4]

Figure 16:
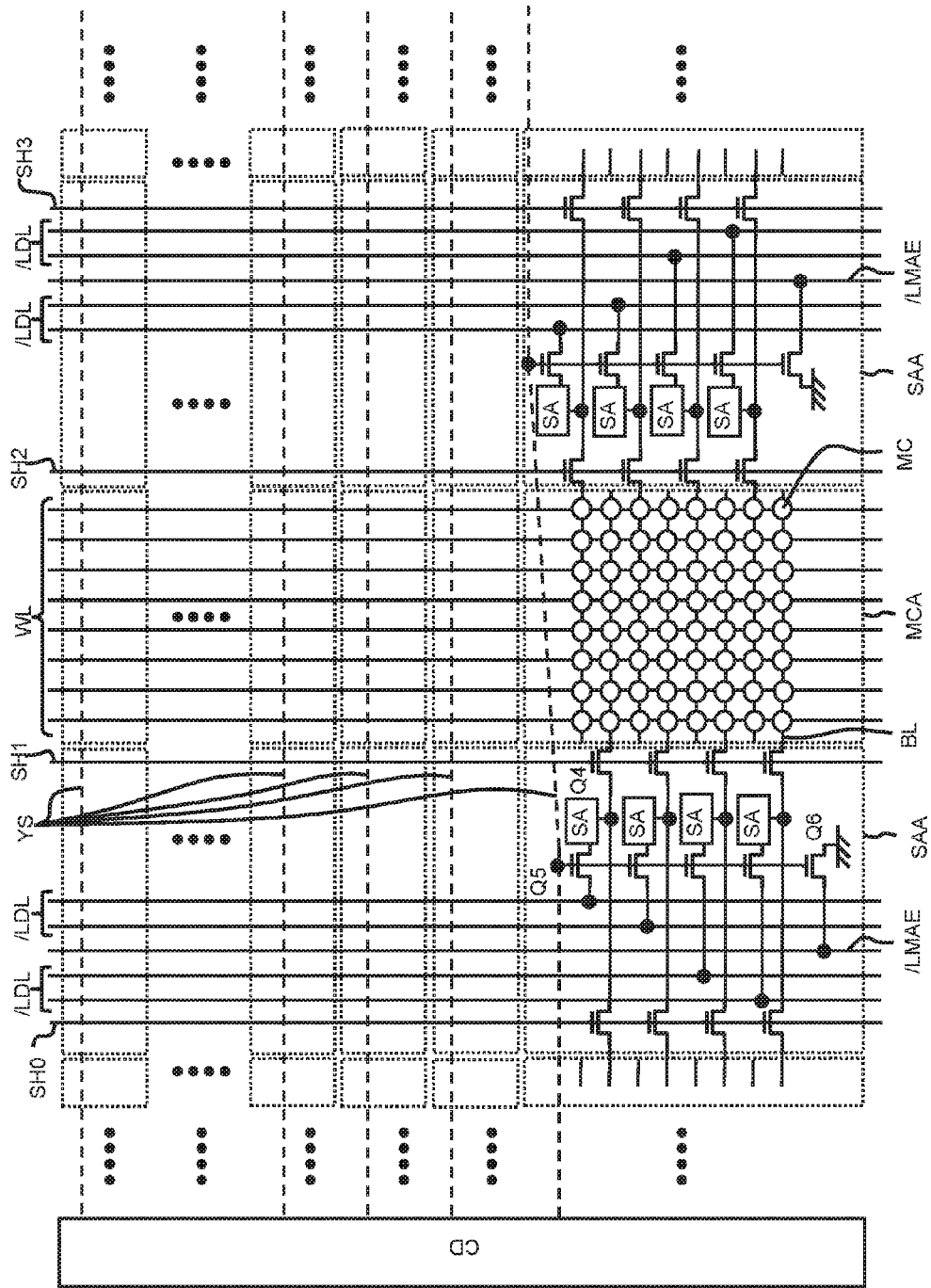
FIG. 16 is a circuit diagram schematically illustrating a memory cell array and sense amplifier areas in a semiconductor storage device according to Exemplary Embodiment 4 of the present invention.
Figure 17:
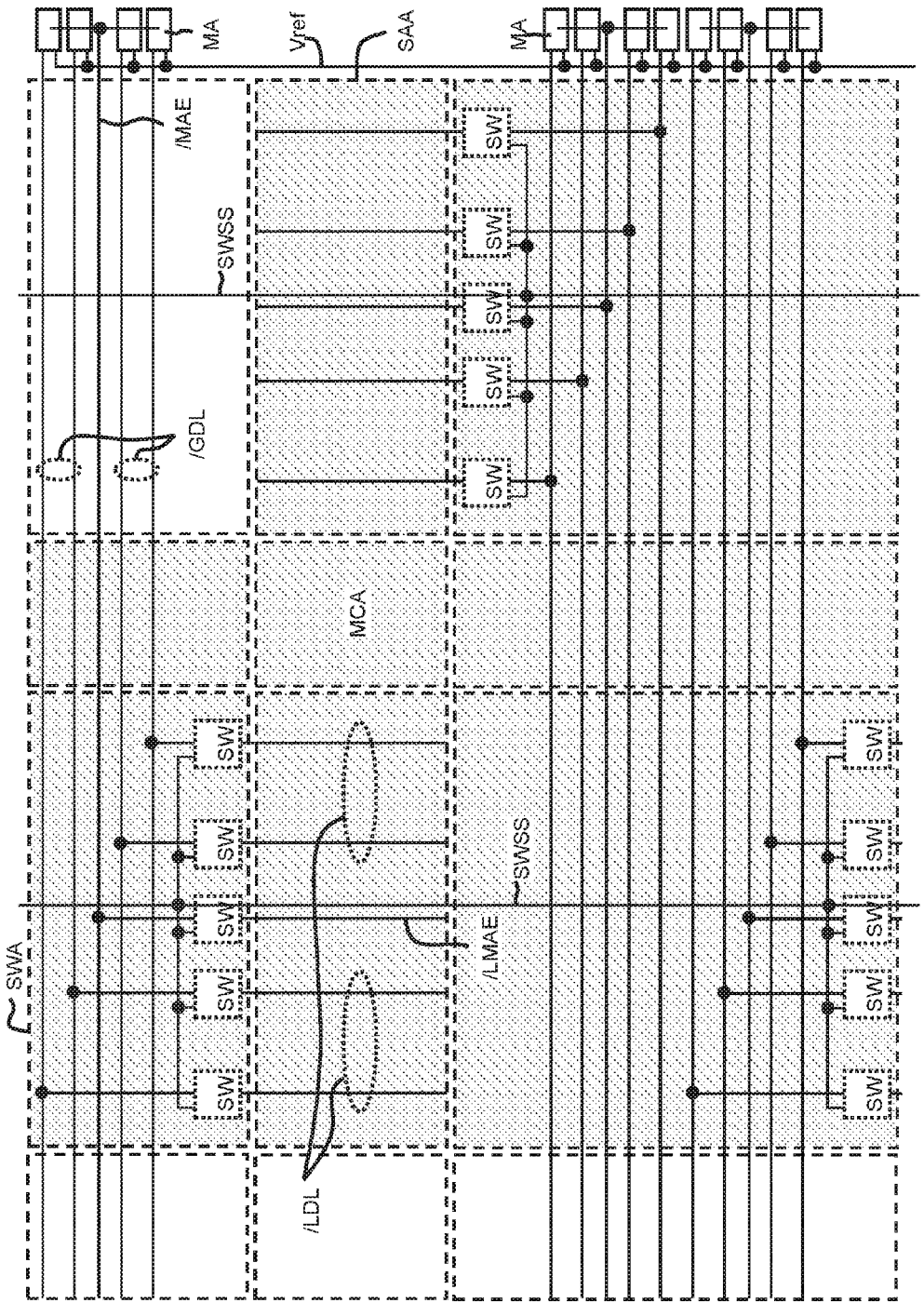
FIG. 17 is a circuit diagram schematically illustrating the configuration of a switch area in a semiconductor storage device according to Exemplary Embodiment 4-1 of the present invention (in which the memory cell array and sense amplifier areas according to Exemplary Embodiment 4 are applied to Exemplary Embodiment 1)
Figure 18:
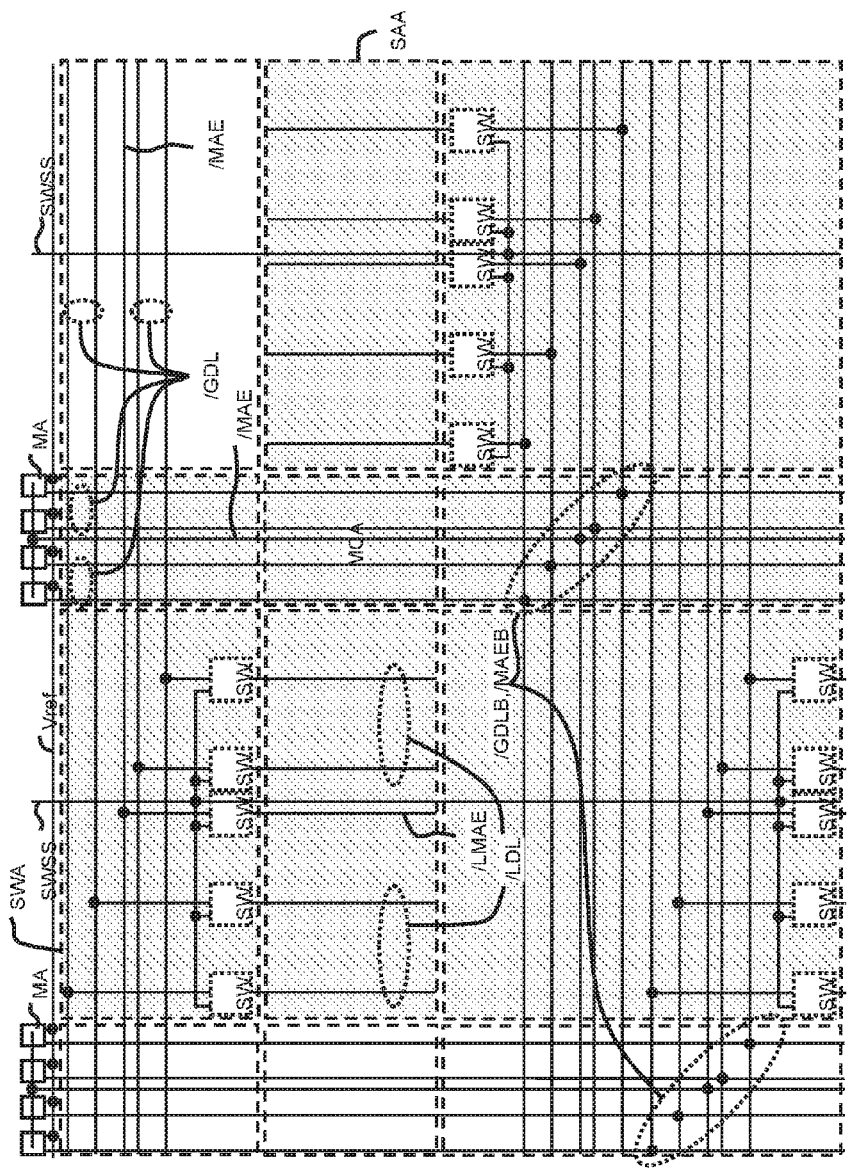
FIG. 18 is a circuit diagram schematically illustrating the configuration of a switch area in a semiconductor storage device according to Exemplary Embodiment 4-2 of the present invention (in which the memory cell array and sense amplifier areas according to Exemplary Embodiment 4 are applied to Exemplary Embodiment 2)
Figure 19:
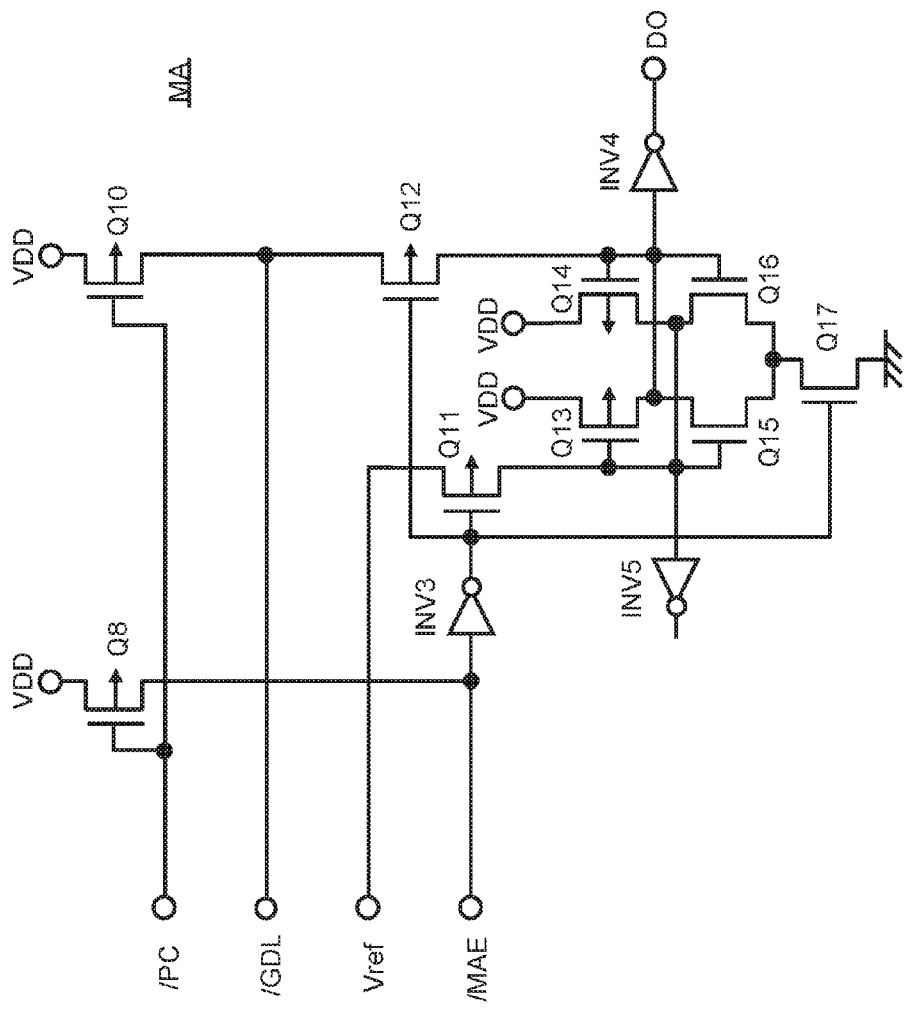
FIG. 19 is a circuit diagram schematically illustrating the configuration of a main amplifier in a semiconductor storage device according to Exemplary Embodiment 4 of the present invention.
Figure 20:
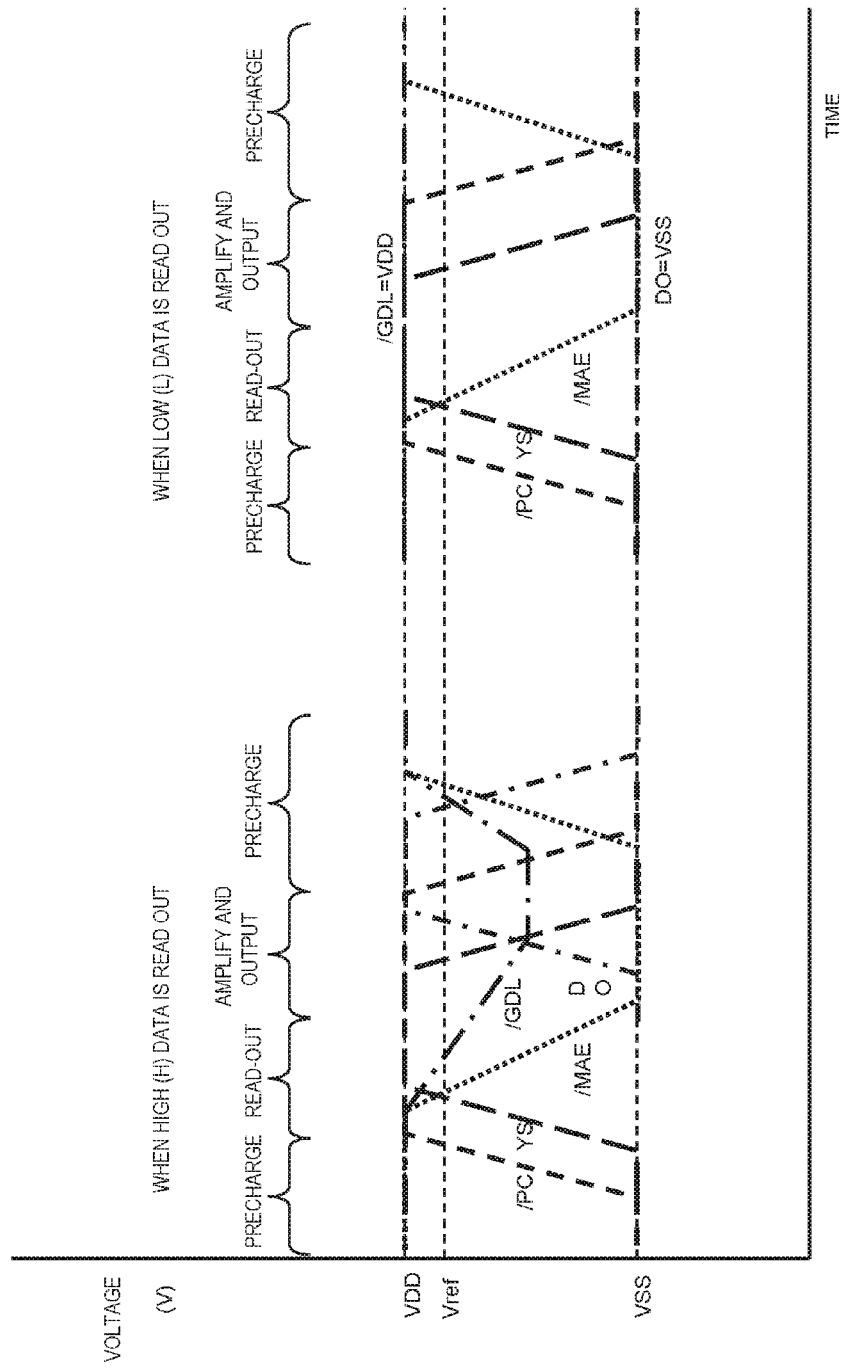
FIG. 20 is a timechart schematically illustrating the operation waveforms of a main amplifier in a semiconductor storage device according to Exemplary Embodiment 4 of the present invention.

A semiconductor storage device according to Exemplary Embodiment 4 of the present invention will be described with reference to the drawings, in which FIG. 16 is a circuit diagram schematically illustrating a memory cell array and sense amplifier area in a semiconductor storage device according to Exemplary Embodiment 4 of the present invention, FIG. 17 is a circuit diagram schematically illustrating the configuration of a switch area(s) in a semiconductor storage device according to Exemplary Embodiment 4-1 of the present invention (in which the memory cell array and sense amplifier areas according to Exemplary Embodiment 4 are applied to Exemplary Embodiment 1), FIG. 18 is a circuit diagram schematically illustrating the configuration of a switch area(s) in a semiconductor storage device according to Exemplary Embodiment 4-2 of the present invention (in which the memory cell array and sense amplifier areas according to Exemplary Embodiment 4 are applied to Exemplary Embodiment 2), FIG. 19 is a circuit diagram schematically illustrating the configuration of a main amplifier in a semiconductor storage device according to Exemplary Embodiment 4 of the present invention, and FIG. 20 is a timechart schematically illustrating the operation waveforms of a main amplifier in a semiconductor storage device according to Exemplary Embodiment 4 of the present invention.

Exemplary Embodiment 4 is a modification of Exemplary Embodiment 3 (see FIGS. 11 to 15). This is a single-ended arrangement in which the local data lines are only /LDL, the global data lines are only /GDL and the bitlines are only BL. It is so arranged that the reference voltage Vref is input to one differential-signal input of differential amplifying main amplifier MA.

With reference to FIG. 16, memory cell MC is placed at the intersection of wordline WL and bitline BL. Sense amplifier SA, column switch nMOS transistor Q5 and main amplifier enable signal generating nMOS transistor Q6 are shared by left and right memory cell arrays MCA. In response to receipt of a corresponding one of shared control signals SH0 to SH3 at its gate, switch nMOS transistor Q4 selectively connects selected bitline BL and sense amplifier SA. Upon receipt of column selection signal YS at its gate, column switch nMOS transistor Q5 selectively connects the selected sense amplifier SA and local data line /LDL. Main amplifier enable signal generating nMOS transistor Q6 is part of a circuit for generating main amplifier enable signal /MAE. Upon receipt of column selection signal YS at its gate, main amplifier enable signal generating nMOS transistor Q6, in synch with the timing at which the selected sense amplifier SA is connected to local data line /LDL, drives the main amplifier enable signal /MAE from the high level of the standby state to the low level of the active state via local main amplifier enable signal line /LMAE at a proximate location. In Exemplary Embodiment 4, four sense amplifiers SA on each of left and right sides of memory cell array MCA, for a total of eight sense amplifiers SA, are selected by a single column selection signal YS.

In FIG. 17, which is a case (Exemplary Embodiment 4-1) where memory cell array MCA and sense amplifier areas SAA according to Exemplary Embodiment 4 of FIG. 16 are applied to Exemplary Embodiment 1, local data lines /LDL and global data lines /GDL are connected by corresponding switches SW by switch selection signal SWSS corresponding to the selected memory cell array MCA. In addition, local main amplifier enable signal /LMAE in the area of local data line /LDL and main amplifier enable signal /MAE in the area of global data line /GDL are connected by a corresponding switch SW. It should be noted that a specific example of the circuit of switch SW is the same as that shown in FIG. 26 and need not be described again (refer to the description of switch SW in Exemplary Embodiment 3).

In FIG. 18, which is a case (Exemplary Embodiment 4-2) where memory cell array MCA and sense amplifier areas SAA according to Exemplary Embodiment 4 of FIG. 16 are applied to Exemplary Embodiment 2, local data lines /LDL and global data lines /GDL are connected by corresponding switches SW by switch selection signal SWSS corresponding to the selected memory cell array MCA. In addition, global data lines /GDL branch at a branch portion (/GDLB) and are connected to main amplifiers MA. On the other hand, local main amplifier enable signal /LMAE in the area of local dataline /LDL and main amplifier enable signal /MAE in the area of global data line /GDL are connected by a corresponding switch SW, and main amplifier enable signal /MAE branches at a branch portion (/MAEB) and is connected to main amplifiers MA.

Thus, in Exemplary Embodiment 4, bitlines BL, sense amplifiers SA, local data lines /LDL and global data lines /GDL are configured in a single-ended arrangement. On the other hand, main amplifiers MA are of the differential amplifying type and, hence, reference voltage Vref is applied as one differential signal input of main amplifiers MA illustrated in FIGS. 17 and 18.

With reference to FIG. 19, the only difference between the circuit of main amplifier MA in Exemplary Embodiment 4 and the circuit of main amplifier MA in Exemplary Embodiment 3 shown in FIG. 14 is that reference voltage Vref is input in place of the signal of one of the global data lines GDL, /GDL and pMOS transistor Q9 for precharging is eliminated. In general, reference voltage Vref is set to a potential substantially intermediate the signal voltages of the high data and low data read out to the global data line /GDL. Other structural elements are similar to those of the main amplifier MA according to Exemplary Embodiment 3 shown in FIG. 14.

With reference to FIG. 20, the left side illustrates a case where high (H) data is read out of a memory cell (MC in FIG. 16) and the right side a case where low (L) data is read out of a memory cell. Here reference voltage Vref has been set to a potential substantially intermediate the signal voltages of the high data and low data read out to the global data line /GDL. Operation in other respects is the same as indicated by the operation waveforms of main amplifier MA according to Exemplary Embodiment 3 shown in FIG. 15.

In accordance with Exemplary Embodiment 4, in a semiconductor storage device, such as a DRAM, having a large-scale memory cell array block, even if readout data is transferred in single-ended fashion, the main amplifier enable signal /MAE also is driven in the vicinity of the selected sense amplifier SA irrespective of which sense amplifier SA among sense amplifiers distributed within the memory cell array block is selected and read out. Consequently, the timing relationship between the readout signal of global data line /GDL and main amplifier activation due to main amplifier enable signal /MAE, which signals are input to the main amplifier MA, is fixed, the number of readout data lines can be halved and chip area reduced while the operating margin of the main amplifier is improved and high-speed readout achieved.

[Exemplary Embodiment 5]

Figure 21:
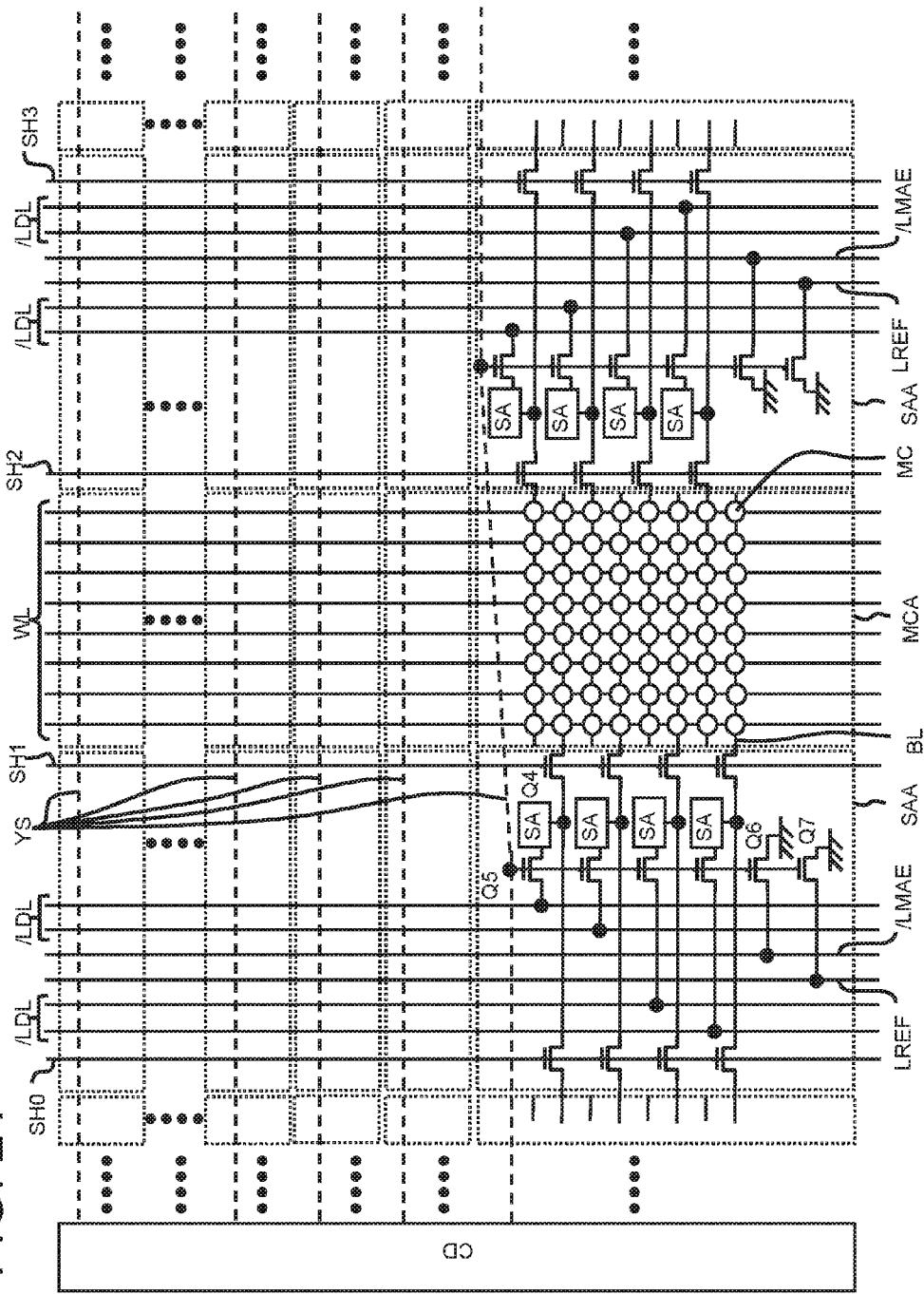
FIG. 21 is a circuit diagram schematically illustrating a memory cell array and sense amplifier areas in a semiconductor storage device according to Exemplary Embodiment 5 of the present invention.
Figure 22:
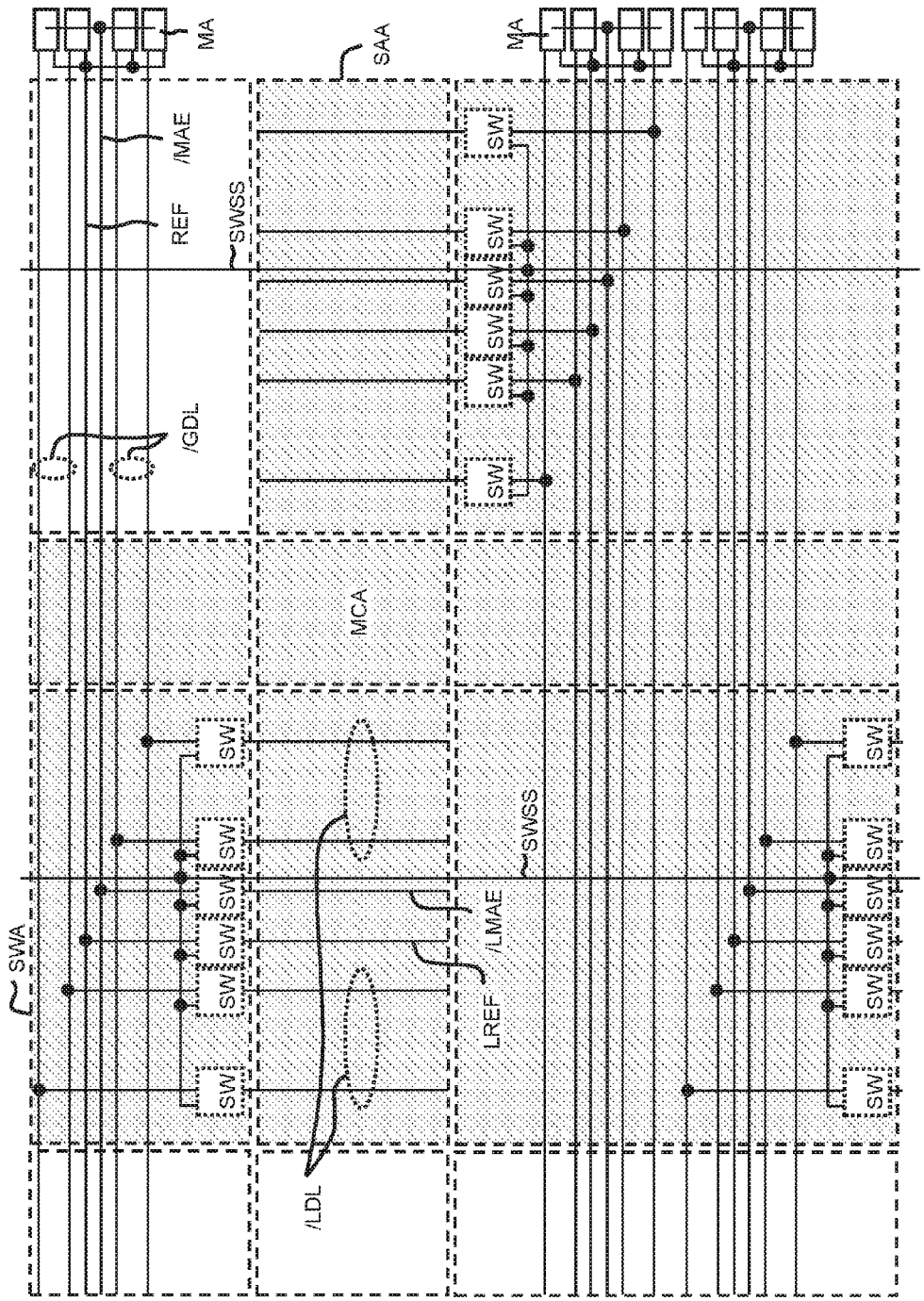
FIG. 22 is a circuit diagram schematically illustrating the configuration of a switch area in a semiconductor storage device according to Exemplary Embodiment 5-1 of the present invention (in which the memory cell array and sense amplifier areas according to Exemplary Embodiment 5 are applied to Exemplary Embodiment 1)
Figure 23:
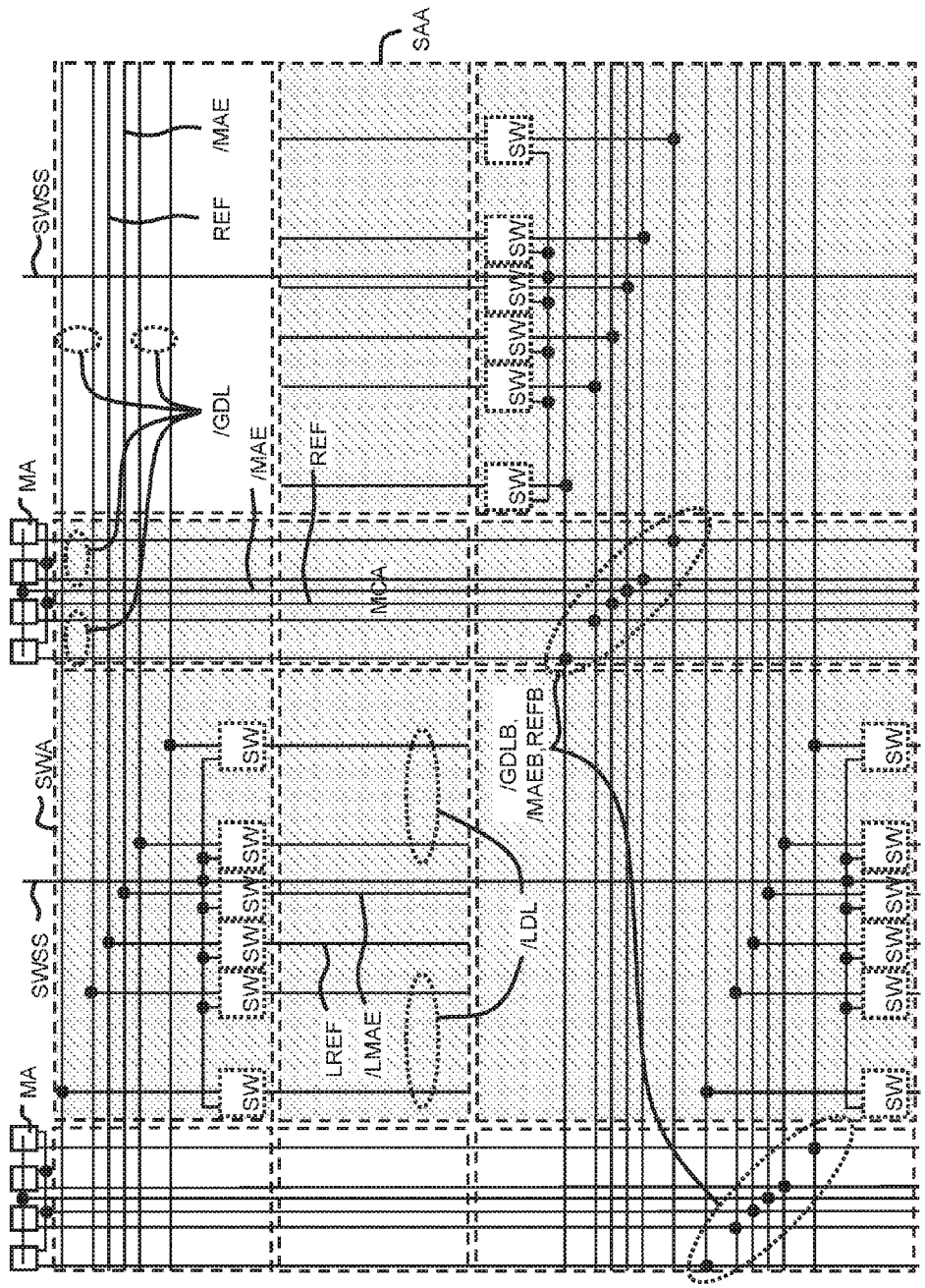
FIG. 23 is a circuit diagram schematically illustrating the configuration of a switch area in a semiconductor storage device according to Exemplary Embodiment 5-2 of the present invention (in which the memory cell array and sense amplifier areas according to Exemplary Embodiment 5 are applied to Exemplary Embodiment 2)
Figure 24:
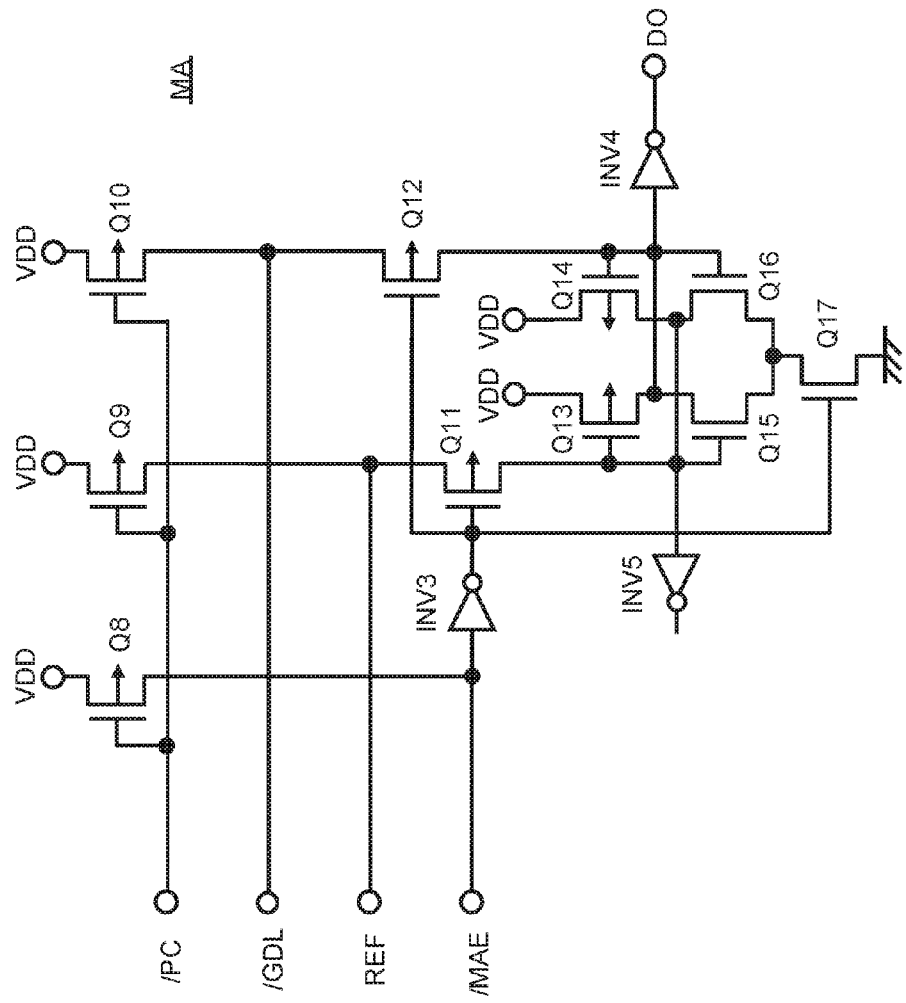
FIG. 24 is a circuit diagram schematically illustrating the configuration of a main amplifier in a semiconductor storage device according to Exemplary Embodiment 5 of the present invention.
Figure 25:
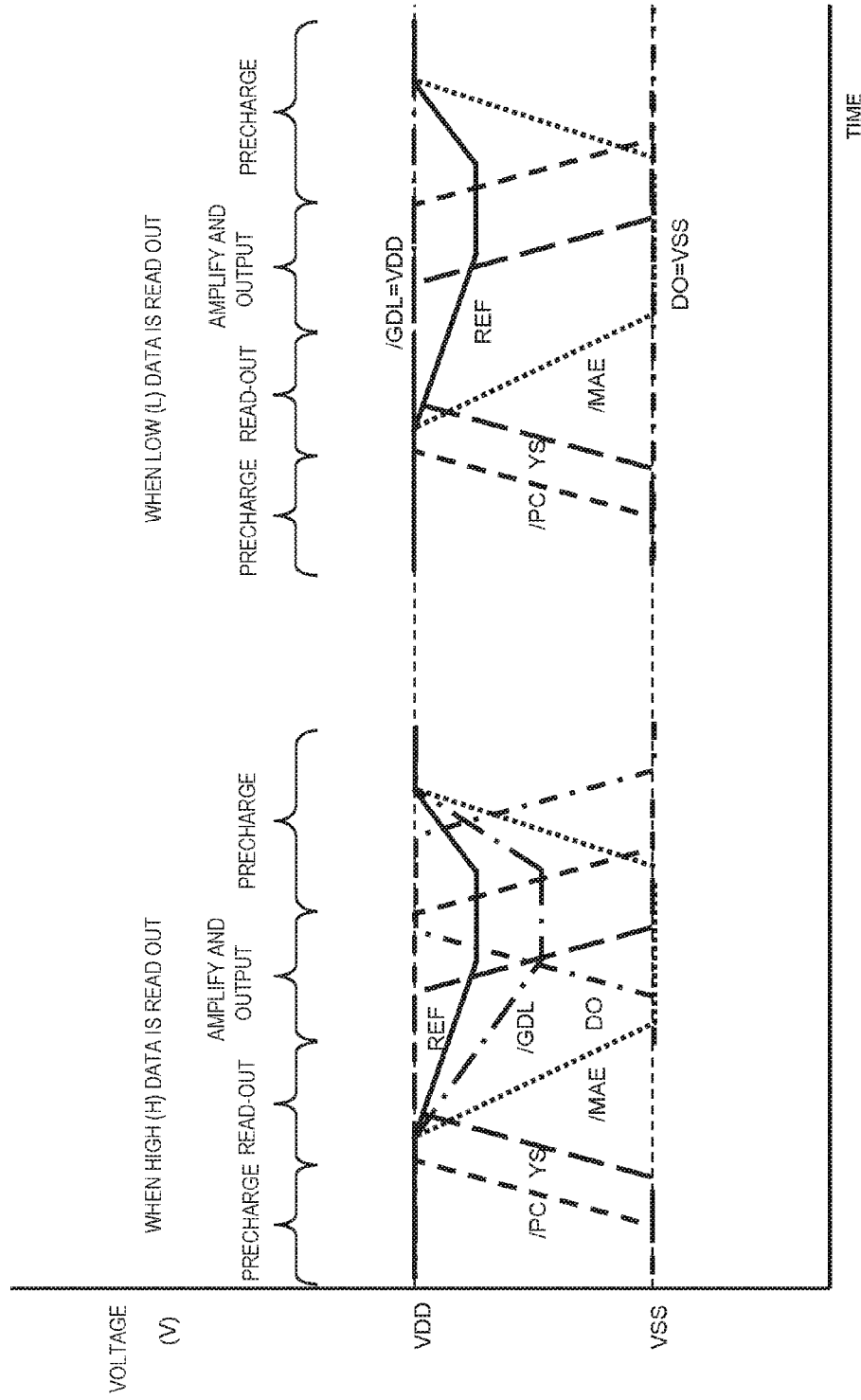
FIG. 25 is a timechart schematically illustrating the operation waveforms of a main amplifier in a semiconductor storage device according to Exemplary Embodiment 5 of the present invention.

A semiconductor storage device according to Exemplary Embodiment 5 of the present invention will be described with reference to the drawings, in which FIG. 21 is a circuit diagram schematically illustrating a memory cell array and sense amplifier areas in a semiconductor storage device according to Exemplary Embodiment 5 of the present invention, FIG. 22 is a circuit diagram schematically illustrating the configuration of a switch area(s) in a semiconductor storage device according to Exemplary Embodiment 5-1 of the present invention (in which the memory cell array and sense amplifier areas according to Exemplary Embodiment 5 are applied to Exemplary Embodiment 1), FIG. 23 is a circuit diagram schematically illustrating the configuration of a switch area (s) in a semiconductor storage device according to Exemplary Embodiment 5-2 of the present invention (in which the memory cell array and sense amplifier areas according to Exemplary Embodiment 5 are applied to Exemplary Embodiment 2), FIG. 24 is a circuit diagram schematically illustrating the configuration of a main amplifier in a semiconductor storage device according to Exemplary Embodiment 5 of the present invention, and FIG. 25 is a timechart schematically illustrating the operation waveforms of a main amplifier in a semiconductor storage device according to Exemplary Embodiment 5 of the present invention.

Exemplary Embodiment 5 is a modification of Exemplary Embodiment 4 (see FIGS. 16 to 20). Here reference signal line REF and nMOS transistor Q7 for generating a reference signal are added on and it is so arranged that reference signal REF is input, in place of reference voltage Vref, to one differential-signal input of differential amplifying main amplifier MA.

The circuit of memory cell array according to Exemplary Embodiment 5 shown in FIG. 21 differs from the circuit of memory cell array MCA according to Exemplary Embodiment 4 shown in FIG. 16 in that it is additionally provided with the nMOS transistor Q7 for generating the reference signal. In response to receipt of column selection signal YS at its gate, the reference signal generating nMOS transistor Q7, in synch with the timing at which the selected sense amplifier (s) SA is (are) connected to local data line /LDL, drives the reference signal REF from the high level of the standby state to the potential of the active state via local reference signal line LREF at a proximate location. The ON current of the reference signal generating nMOS transistor Q7 has been set in such a manner that the potential of the active state becomes a potential intermediate the signal potentials of the high data and low data read out to the local data line /LDL. Structure and operation in other respects are similar to those of Exemplary Embodiment 4 shown in FIG. 16.

FIG. 22 illustrates a case (Exemplary Embodiment 5-1) where memory cell array MCA and sense amplifier areas SAA according to Exemplary Embodiment 5 of FIG. 21 are applied to Exemplary Embodiment 1. This case (Exemplary Embodiment 5-1) differs from Exemplary Embodiment 4-1 shown in FIG. 17 in that it is additionally provided with a wiring path for reference signal line REF. The reference signal line REF is connected to one differential input of main amplifier MA taking the same path as that of local data line /LDL, local main amplifier enable signal /LMAE, global data line /GDL and main amplifier enable signal /MAE. Structure and operation in other respects are similar to those of Exemplary Embodiment 4-1 shown in FIG. 17.

FIG. 23 illustrates a case (Exemplary Embodiment 5-2) where memory cell array MCA and sense amplifier areas SAA according to Exemplary Embodiment 5 of FIG. 21 are applied to Exemplary Embodiment 2. This case (Exemplary Embodiment 5-2) differs from Exemplary Embodiment 4-2 shown in FIG. 18 in that it is additionally provided with a wiring path for reference signal line REF. The reference signal line REF is connected to one differential input of main amplifier MA taking the same path as that of local data line /LDL, local main amplifier enable signal /LMAE, global data line /GDL and main amplifier enable signal /MAE. Structure and operation in other respects are similar to those of Exemplary Embodiment 4-2 shown in FIG. 18.

Thus, in Exemplary Embodiment 5, bitlines BL, sense amplifiers SA, local data lines /LDL and global data lines /GDL are configured in a single-ended arrangement. On the other hand, main amplifiers MA are of the differential amplifying type and, hence, reference signal REF is applied as one differential signal input of main amplifiers MA illustrated in FIGS. 22 and 23.

With reference to FIG. 24, the only difference between the circuit of main amplifier MA in Exemplary Embodiment 5 and the circuit of main amplifier MA in Exemplary Embodiment 3 shown in FIG. 14 is that reference signal REF is input in place of global data line GDL. In general, reference signal REF is set in such a manner that a signal voltage substantially intermediate the signal voltages of the high data and low data read out to the global data line /GDL will emerge. Other structural elements are similar to those of the main amplifier MA according to Exemplary Embodiment 3 shown in FIG. 14.

With reference to FIG. 25, the left side illustrates a case where high (H) data is read out of a memory cell (MC in FIG. 21) and the right side a case where low (L) data is read out of a memory cell. Here reference signal REF has been set in such a manner that a signal voltage substantially intermediate the signal voltages of the high data and low data read out to the global data line /GDL will emerge. Operation in other respects is the same as indicated by the operation waveforms of main amplifier MA according to Exemplary Embodiment 3 shown in FIG. 15.

In accordance with Exemplary Embodiment 5, in a semiconductor storage device, such as a DRAM, having a large-scale memory cell array block, the main amplifier enable signal /MAE and reference signal REF also are driven in the vicinity of the selected sense amplifier SA irrespective of which sense amplifier SA among sense amplifiers distributed within the memory cell array block is selected and read out. Consequently, the timing relationship among the readout signal of global data line /GDL, reference signal REF and main amplifier activation due to main amplifier enable signal /MAE, which signals are input to the main amplifier MA, is fixed, the operating margin of the main amplifier MA can be improved and high-speed readout achieved. Further, the timing of the readout reference signal REF of main amplifier MA and the transfer timing of the readout data can always be made to coincide. This means that even if readout data is transferred in single-ended fashion, it can be amplified as a differential signal in the main amplifier MA. The number of readout data lines can be halved and chip area reduced while the operating margin of the semiconductor storage device is assured.

Within the bounds of the full disclosure of the present invention (inclusive of the scope of the claims), it is possible to modify and adjust the modes and embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

What is claimed is:

1. A semiconductor device comprising:
   a plurality of memory cell arrays each of which includes a plurality of memory cells;
   bitlines extending in a first direction in the memory cell arrays to transfer data stored in the memory cells;
   wordlines extending in a second direction substantially perpendicular to the first direction in the memory cell arrays to select at least one of the memory cells of one or more selected memory cell arrays of the plurality of memory cell arrays;
   local data lines which extend parallel to the wordlines outside of the memory cell arrays and which convey signals from the bitlines, the signals conveyed from the bitlines representing data transferred from the at least one memory cells of the one or more selected memory cell arrays; and
   global data lines configured to convey signals from the local data lines;
   wherein the global data lines include at least one global data line having a part extending parallel to the wordlines and the part is disposed over a memory cell array that is not a selected memory cell array, wherein the at least one global data line has another part that is arranged between two adjacent memory cell arrays of the plurality of memory cell arrays, the other part being substantially perpendicular to the part extending parallel to the wordlines.

2. The semiconductor device as claimed in claim 1, wherein the part extending parallel to the wordlines is coupled to a main amplifier outside of the memory cell arrays.

3. The semiconductor device as claimed in claim 2, further comprising a main amplifier enable line configured to convey a signal activating the main amplifier, wherein the main amplifier enable line extends alongside of a corresponding local data line of the local data lines and a corresponding global data line of the global data lines.

4. The semiconductor device as claimed in claim 2, further comprising a main amplifier enable line configured to convey a signal activating the main amplifier, wherein the main amplifier enable line is disposed over the non-selected memory cell array.

5. The semiconductor device as claimed in claim 1, wherein the other part of the at least one global data line is between the local data lines and the part extending parallel to the wordlines.

6. A semiconductor device comprising:
   a memory cell array including a plurality of memory cells;
   bitlines extending in one direction in the memory cell array to transfer data stored in the memory cells;
   wordlines extending perpendicular to the bitlines in the memory cell array to select at least one of the memory cells;
   local data lines which extend parallel to the wordlines outside of the memory cell array and which convey signals from bitlines;
   global data lines which convey signals from the local data lines;
   wherein the global data lines includes a first global data line, the first global data line having a first part arranged between the memory cell array and an adjacent memory cell array and a second part extending parallel to the wordlines and being perpendicular to the first part, and the second part is disposed over the memory cell array.

7. The semiconductor device as claimed in claim 6, wherein the second part couples to a main amplifier outside of the memory cell arrays.

8. The semiconductor device as claimed in claim 7, further comprising a main amplifier enable line configured to convey a signal activating the main amplifier, wherein the main amplifier enable line extends alongside of a corresponding local data line of the local data lines and a corresponding global data line of the global data lines.

9. The semiconductor device as claimed in claim 7, further comprising a main amplifier enable line configured to convey a signal activating the main amplifier, wherein the main amplifier enable line is disposed over the memory cell array.

10. The semiconductor device as claimed in claim 6, wherein the first part of the first global data line extends between the second part and the local data lines.

11. The semiconductor device as claimed in claim 1, wherein the non-selected memory cell array is located at a different position along the first direction than any of the one or more selected memory cell arrays.

12. The semiconductor device as claimed in claim 1, wherein the two adjacent memory cell arrays are selected memory cell arrays.

13. The semiconductor device as claimed in claim 12, wherein the two adjacent memory cell arrays are selected simultaneously.

14. The semiconductor device as claimed in claim 1, wherein each local data line does not extend along multiple memory cell arrays located at different positions in the second direction.

15. The semiconductor device as claimed in claim 6, wherein the adjacent memory cell array is adjacent to the memory cell array along the wordline direction.

* * * * *